(12) United States Patent
Natsui et al.

(10) Patent No.: US 11,862,217 B2
(45) Date of Patent: Jan. 2, 2024

(54) DEVICE, SENSOR NODE, ACCESS CONTROLLER, DATA TRANSFER METHOD, AND PROCESSING METHOD IN MICROCONTROLLER

(71) Applicant: TOHOKU UNIVERSITY, Sendai (JP)

(72) Inventors: Masanori Natsui, Sendai (JP); Daisuke Suzuki, Sendai (JP); Akira Tamakoshi, Sendai (JP); Takahiro Hanyu, Sendai (JP); Tetsuo Endoh, Sendai (JP); Hideo Ohno, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 17/430,000

(22) PCT Filed: Feb. 15, 2020

(86) PCT No.: PCT/JP2020/005928
§ 371 (c)(1),
(2) Date: Feb. 1, 2022

(87) PCT Pub. No.: WO2020/166725
PCT Pub. Date: Aug. 20, 2020

(65) Prior Publication Data
US 2022/0157361 A1 May 19, 2022

(30) Foreign Application Priority Data
Feb. 16, 2019 (JP) .................................. 2019-026134

(51) Int. Cl.
*G11C 11/16* (2006.01)
*G06F 17/14* (2006.01)

(52) U.S. Cl.
CPC ........ *G11C 11/1673* (2013.01); *G06F 17/142* (2013.01); *G11C 11/1653* (2013.01); *G11C 11/1675* (2013.01); *G11C 11/1697* (2013.01)

(58) Field of Classification Search
CPC ............ G11C 11/1697; G11C 11/1675; G11C 11/1653; G11C 11/1673
(Continued)

(56) References Cited

U.S. PATENT DOCUMENTS 10,396,778 B1 * 8/2019 Narayan ............ H03K 19/0016
11,146,564 B1 * 10/2021 Ankam ................. H04L 63/102
(Continued)

FOREIGN PATENT DOCUMENTS

| JP | 11-203196 A | 7/1999 |
| JP | 2015-52940 A | 3/2015 |

OTHER PUBLICATIONS

Ahmed, New FPGA Blind Scrubbing Technique, 2016 IEEE (Year: 2016).*
(Continued)

*Primary Examiner* — Sung Il Cho
(74) *Attorney, Agent, or Firm* — WHDA, LLP

(57) ABSTRACT

The present invention provides a device with low power and high performance, which can be applied to sensor nodes, a sensor node using the same, an access controller, a data transfer method, and execute a processing method in a microcontroller. The device has: an MRAM; a non-volatile CPU configured to include a nonvolatile memory; a non-volatile FPGA-ACC configured to include a nonvolatile memory and execute a part of operations on the nonvolatile CPU; and a power-gating control unit that controls power supply to each memory cell in the MRAM, the non-volatile CPU, and the non-volatile FPGA-ACC. The device is further provided with an access controller that controls accesses to the MRAM by reading data in advance and backing up the data when data is to be read from the MRAM.

25 Claims, 37 Drawing Sheets

(58) Field of Classification Search
USPC .......................................................... 365/209
See application file for complete search history.

(56) References Cited

U.S. PATENT DOCUMENTS

| | | | |
|---|---|---|---|
| 2016/0189761 A1 | 6/2016 | Noguchi et al. | |
| 2019/0205244 A1* | 7/2019 | Smith ..................... | G06F 3/065 |
| 2019/0220601 A1* | 7/2019 | Sood ....................... | G06F 9/505 |
| 2019/0237124 A1* | 8/2019 | Cha ..................... | G11C 11/4074 |

OTHER PUBLICATIONS

Onuki et al., "Embedded Memory and ARM Cortex-M0 Core Using 60-nm C-Axis Aligned Crystalline Indium-Gallium-Zinc Oxide FET Integrated With 65-nm Si CMOS", JSSC, 2017, vol. 52, Iss. 4, cited in Specification (8 pages).
Liu et al., "A 65 nm ReRAM-Enabled Nonvolatile Processor with 6× Reduction in Restore Time and 4× Higher Clock Frequency Using Adaptive Data Retention and Self-Write-Termination Nonvolatile Logic", ISSCC, 2016, pp. 84-86, cited in Specification (3 pages).
Tsuji et al., "Sub-µW Standby Power, <µW/DMIPS@25MHz MCU with Embedded Atom-switch Programmable Logic and ROM", Symposium on VLSI Technology Digest of Technical Papers, 2015, pp. T86-T87, cited in Specification (2 pages).
Singhal et al., "A 10.5µA/MHz at 16MHz Single-Cycle Non-Volatile Memory Access Microcontroller with Full State Retention at 108nA in a 90nm Process", ISSCC, 2015, pp. 148-150, cited in Specification (3 pages).
Sakimura et al., "A 90 nm 20MHz Fully Nonvolatile Microcontroller for Standby-Power-Critical Applications", ISSCC, 2014, pp. 184-186, cited in Specification (3 pages).
Natsui et al., "Design of a memory-access controller with 3.71-times-enhanced energy efficiency for Internet-of-Things-oriented nonvolatile microcontroller unit", Japanese Journal of Applied Physics, Feb. 16, 2018, vol. 57, 04FN03, https://iopscience.iop.org/article/10.7567/JJAP.57.04FN03, cited in ISR and Written Opinion (6 pages).
Natsui et al., "A 47.14-µW 200-MHz MOS/MTJ-Hybrid Nonvolatile Microcontroller Unit Embedding STT-MRAM and FPGA for IoT Applications", IEEE Journal of Solid-State Circuits, 2019, vol. 54, No. 11, pp. 2991-3004, cited in ISR (14 pages).
Natsui et al., "Brain-Inspired LSI Design Technology for Next Generation IoT Society", IEICE General Conference, 2018, pp. SS-51-SS-52, w/English translation (10 pages).
Natsui et al., "MTJ-Based Nonvolatile Logic LSI for Ultra Low-Power and Highly Dependable Computing", China Semiconductor Technology International Conference (CSTIC), 2018 (4 pages).
Natsui et al., "CPU-to-Memory Data Transfer Technology for Realizing Low-Power and High-Performance Nonvolatile MCUs", ImPACT Sahashi Program Public Results Briefing, 2018, w/English translation (4 pages).
Hanyu, "Prospects of Nonvolatile Logic LSI Using MTJ/MOS-Hybrid Circuitry and Its Application", International Conference on Solid State Devices and Materials (SSDM2018), 2018, pp. 115-116 (2 pages).
Hanyu, "Design of an MTJ-Based Nonvolatile Logic LSI and Its Application", 18th Non-Volatile Memory Technology Symposium (NVMTS2018), 2018 (1 page).
"World's First Demonstration of Nonvolatile Microcomputer which achieves both high performance (operating frequency of 200 MHz) and ultra-low power consumption (average power of 50 (W or less) by using spintronics integrated circuit technology", Feb. 19, 2019, https://www.tohoku.ac.jp/japanese/newimg/pressimg/tohokuuniv_press_20190219_01_ISSCC_web.pdf, w/English translation (13 pages).
"Development of nonvolatile spintronics-based 50µW microcontroller unit operating at 200MHz", 2019, https://www.tohoku.ac.jp/en/press/research20190218_MCU.html (3 pages).
Natsui et al., "An FPGA-Accelerated Fully Nonvolatile Microcontroller Unit for Sensor-Node Applications in 40nm CMOS/MTJ-Hybrid Technology Achieving 47.14µW Operation at 200MHz", IEEE International Solid-State Circuits Conference, Feb. 17-21, 2019, pp. 200-204 (6 pages).
Suzuki et al., "Fabrication of a 3000-6-Input-LUTs Embedded and Block-Level Power-Gated Nonvolatile FPGA Chip Using p-MTJ-Based Logic-in-Memory Structure", Symposium on VLSI Circuits Digest of Technical Papers, 2015, pp. C172-C173 (2 pages).
Suzuki et al., "Design and fabrication of a perpendicular magnetic tunnel junction based nonvolatile programmable switch achieving 40% less area using shared-control transistor structure", Journal of Applied Physics, 2014, vol. 115, 17B742, https://doi.org/10.1063/1.4868332 (4 pages).
Suzuki et al., "Six-input lookup table circuit with 62% fewer transistors using nonvolatile logic-in-memory architecture with series/parallel-connected magnetic tunnel junctions", Journal of Applied Physics, 2012, vol. 111, 07E318, https://doi.org/10.1063/1.3672411 (4 pages).
Suzuki et al., "Design of a Compact Nonvolatile Four-Input Logic Element Using a Magnetic Tunnel Junction and Metal-Oxide-Semiconductor Hybrid Structure", Japanese Journal of Applied Physics, 2012, vol. 51, 04DM02 (6 pages).
International Search Report dated May 19, 2020, issued in counterpart International Application No. PCT/JP2020/005928 (3 pages).
Written Opinion dated May 19, 2020, issued in counterpart International Application No. PCT/JP2020/005928, with International Preliminary Report on Patentability (Form PCT/IB/373) dated Aug. 10, 2021 (8 pages).

* cited by examiner

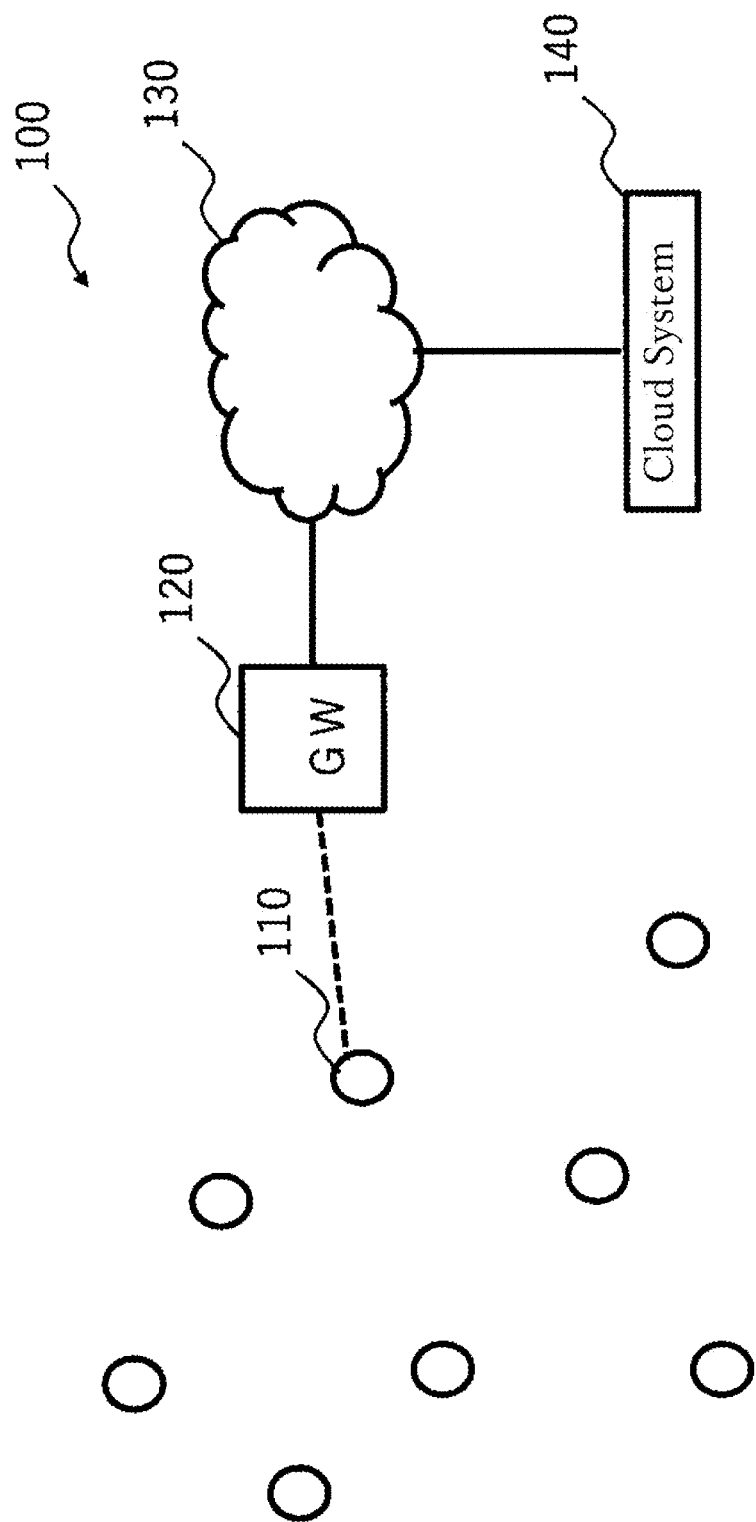

FIG. 33

| Performance metrics | Example | JSSC'17 [1] | ISSCC'16 [2] | VLSI'15 [3] | ISSCC'15 [4] | ISSCC'14 [5] |
|---|---|---|---|---|---|---|
| Architecture | Cortex-M0 32 bit | Cortex-M0 32 bit | 8051 8 bit | MSP430 16 bit | MSP430 16 bit | MSP430 16 bit |
| MOS technology | 40-nm LVT,SVT,HVT | 65-nm Low Leakage | 65-nm SVT | 65-nm SOTB | 90-nm SVT,HVT | 90-nm SVT |
| Memory technology | 2T-STT-MRAM 64 kB | CAAC-IGZO 8 kB | ReRAM 8 kB nvSRAM 4 kB | Atom-switch 16 kB | N/A | 3T-SpinRAM 64 kB |
| Flip-flops in CPU | Nonvolatile | Nonvolatile | Nonvolatile | Volatile | Volatile | Nonvolatile |
| Embedded programmable logic | Yes (6-LUTs x 1,176 & DSPs x 7) | No | No | Yes (4-LUTs x 2,000) | No | No |
| Supply voltage [V] | 1.8/3.3 (Peri.) 1.1-1.3 (Core) | 3.3 (CAAC-IGZO) 1.1 (CMOS) | 3 (HV) 0.8 (Core) | 0.41 | 0.72 | 1.8-3.3 (Dvcc) 1.0 (Core) |
| Frequency [MHz] | 200 | 30 | 100 | 25 | 16 | 20 |
| Active power [μW/MHz] | 26.7 | 28.2 | 33 | 33 | 28.3 | 145 |
| Standby power [μW] | 0.7 | 0.009 | N/A | 0.7 | 0.32 | 1.2 |
| Average power [μW] | 47.14 | 143.3 | >2900 | 583.2 | 499.8 | 2560 |

DEVICE, SENSOR NODE, ACCESS CONTROLLER, DATA TRANSFER METHOD, AND PROCESSING METHOD IN MICROCONTROLLER

TECHNICAL FIELD

The present invention relates to a device, a sensor node, an access controller, a data transfer method, and a processing method in a microcontroller. More specifically, it relates to a microcontroller unit (MCU) and a sensor node, which are devices with lower power and higher performance in IoT (Internet-of-Things) applications, an access controller, a data transfer method, and a processing method in a microcontroller.

BACKGROUND ART

A microcontroller unit with low power consumption and high performance, which can be applied to sensor nodes with power supply, has been required. In order to achieve this requirement, the use of a nonvolatile memory embedded into an MCU has been developed (Non Patent Literatures 1 to 5). For example, Non Patent Literature 1 discloses a nonvolatile MCU demonstrating a 32-bit operation at 30 MHz and Non Patent Literature 2 discloses a nonvolatile MCU demonstrating an 8-bit operation at 100 MHz.

CITATION LIST

Non Patent Literature

Non Patent Literature 1: T. Onuki, et al., "Embedded Memory and ARM Cortex-M0 Core Using 60-nm C-Axis Aligned Crystalline Indium-Gallium-Zinc Oxide FET Integrated With 65-nm Si CMOS," JSSC, vol. 52, Iss. 4, pp. 925-932, 2017.
Non Patent Literature 2: Y. Liu, et al., "A 65 nm ReRAM-Enabled Nonvolatile Processor with 6×Reduction in Restore Time and 4×Higher Clock Frequency Using Adaptive Data Retention and Self-Write-Termination Nonvolatile Logic," ISSCC, pp. 84-86, 2016.
Non Patent Literature 3: Y. Tsuji, et al., "Sub-µW Standby Power, <18 µW/DMIPS@25 MHz MCU with Embedded Atom-switch Programmable Logic and ROM," Symp. VLSI Tech., pp. T86-T87, 2015.
Non Patent Literature 4: V. Singhal, et al., "A 10.5 µA/MHz at 16 MHz Single-Cycle Non-Volatile Memory Access Microcontroller with Full State Retention at 108 nA in a 90 nm Process," ISSCC, pp. 148-150, 2015.
Non Patent Literature 5: N. Sakimura, et al., "A 90 nm 20 MHz Fully Nonvolatile Microcontroller for Standby-Power-Critical Applications," ISSCC, pp. 184-186, 2014.

SUMMARY OF INVENTION

Technical Problem

However, the MCU performance disclosed in these literatures is not suitable for a sensor node that processes a large number of received signals and extracts efficient information. Because these MCUs cannot suppress the data amount transferred to the data center.

Therefore the present invention aims to provide a device with low power and high performance, which can be applied to sensor nodes as well as a sensor node using the device. In addition, the present invention also aims to provide an access controller, a data transfer method, and a processing method in a microcontroller.

The present invention has the following concepts.
[1] A device including:
  an MRAM configured to include multiple memory cells separated into multiple regions including selection transistors and MTJs;
  a nonvolatile CPU configured to include a nonvolatile memory;
  a nonvolatile FPGA-ACC configured to include a nonvolatile memory and execute a part of operations on the nonvolatile CPU; and
  a power-gating controller that controls power supply to each memory cell in the MRAM, the nonvolatile CPU, and the nonvolatile FPGA-ACC.
[2] The device according to [1], wherein
  the nonvolatile CPU transmits data to the MRAM, allowing the nonvolatile FPGA-ACC to read the data from the NRAM; and
  the nonvolatile FPGA-ACC transmits data to the MRAM, allowing the nonvolatile CPU to read the data from the MRAM.
[3] The device according to [1] or [2], wherein
  the nonvolatile FPGA-ACC includes a nonvolatile memory function, which stores configuration data.
[4] The device according to any one of [1] to [3], wherein
  each memory cell in the MRAM is configured with 2T-2MTJ including two selection transistors and two MTJs.
[5] The device according to any one of [1] to [4], wherein
  each of the multiple regions in the MRAM is configured with divided blocks and power-gating is performed for each of the divided blocks.
[6] The device according to any one of [1] to [5], wherein
  the nonvolatile FPGA-ACC includes:
    a tile that performs a part of the operations on the nonvolatile CPU instead of the nonvolatile CPU; and
    a DSP (Digital Signal Processor) that performs a part of the operations on the nonvolatile CPU instead faster than the tile.
[7] The device according to any one of [1] to [6], further including:
  an access controller that controls an access to the MRAM by reading and storing data in advance when data are read from the MRAM.
[8] The device according to [7], wherein
  the access controller receives a data-reading instruction from the nonvolatile CPU and determines whether or not the data have been read from the MRAM in advance, and if the data have been already read, the access controller transmits the stored data to the nonvolatile CPU.
[9] The device according to [7] or [8], wherein
  the access controller includes:
    an address-storing register that receives an MRAM address that is a reading destination as input, the address-storing resister storing the address;
    a multiplexer that outputs multiple destinations of the MRAM stored in the address-storing register to the MRAM for reading;
    multiple data-storing registers that store data read from the MRAM; and
    a comparator that receives a reading instruction together with a specified reading destination and compares an address related to the specified reading destination with a reading address stored in the address-storing register, wherein
the access controller that receives a reading instruction together with a specified reading destination and outputs data already read and stored in any one of the data-storing registers in response to the reading instruction when the comparator determines the data have been read from the MRAM in advance.

[10] The access controller according to [9], further including:
a prefetch address generator connected to the multiplexer, wherein
the prefetch address generator generates an address including a reading address destination stored in the address-storing register.

[11] The device according to any one of [1] to [10], being usable when an average power is no more than 100 µW.

[12] The device according to any one of [1] to [11], wherein an intermittent operation interval can be set to no more than 100 ms.

[13] A sensor node, configured to include the device according to any one of [1] to [12].

[14] An access controller, including:
an address-storing register that receives an MRAM address that is a reading destination as input, the address-storing resister storing the address;
a multiplexer that outputs multiple destinations of the MRAM stored in the address-storing register to the MRAM for reading;
multiple data-storing registers that store data read from the MRAM; and
a comparator that receives a reading instruction together with a specified reading destination and compares an address related to the specified reading destination with a reading address stored in the address-storing register, wherein
the access controller that receives a reading instruction together with a specified reading destination and outputs data already read and stored in ally one of the data-storing registers in response to the reading instruction when the comparator determines the data have been read from the MRAM in advance.

[15] The access controller according to [14], further including:
a prefetch address generator connected to the multiplexer, wherein
the prefetch address generator generates an address including a reading address destination stored in the address-storing register.

[16] A data transfer method between a CPU and an MRAM via an access controller, including:
the access controller receiving a data-reading instruction from the CPU together with a reading address;
the access controller reading multiple address data including the reading address from the MRAM in advance;
the access controller receiving a data-reading instruction from the CPU together with a next reading address; and
the access controller determining whether or not the data have been already read and responding to the reading instruction, if the reading instruction is for an already-read data, using the data read in advance without performing data-reading from the MRAM.

[17] A processing method in a microcontroller including a nonvolatile CPU, an MRAM, and a nonvolatile FPGA-ACC as a reconfigurable computing module, wherein the MRAM is configured with a region to store data transmitted between the nonvolatile CPU and the nonvolatile FPGA-ACC, and
the method includes:
the MRAM writing data into the region, the data being input from the nonvolatile CPU to the nonvolatile FPGA-ACC;
the nonvolatile CPU passing a signal indicating completion of preparation for the writing and starting a calculation to the nonvolatile FPGA-ACC;
the nonvolatile FPGA-ACC starting an operation by using the data written in the region; and
the nonvolatile CPU being passed an operation result computed by the nonvolatile FPGA-ACC to the nonvolatile CPU through the region.

[18] The processing method in the microcontroller according to [17], wherein
the nonvolatile CPU and the nonvolatile FPGA-ACC are subject to power-gating control.

[19] The processing method in the microcontroller according to [18], wherein
the power-gating control does not include data-store or restore operations.

[20] The processing method in the microcontroller according to any one of [17] to [19], wherein
computing by the nonvolatile FPGA-ACC relates to any one of processing of a Laplacian filter, a DCT (Discrete Cosine Transform), an FIR (Finite Impulse Response) filter, and an FFT (Fast Fourier Transform).

[21] The processing method in the microcontroller according to any one of [17] to [20], wherein
the nonvolatile CPU and a nonvolatile FPGA-based accelerator parallelly processing.

Advantageous Effects of Invention

According to the present invention, it is possible to cut wasteful power consumption because an MRAM, an NV-CPU, and an NV-FPGA are configured using nonvolatile memory cells, in which stored data do not need to be backed up; and a power-gating controller stops power supply to each module in the MRAM, the NV-CPU, and the NV-FPGA, or inactive units, that is, power-gating. In addition, it is possible to implement various signal processing at high speed because an NV-FPGA provided with a reconfigurable computing module is configured; and an access controller enables an effective data transfer between the NV-CPU and the MRAM, which allows the whole system to operate at high speed. Thus, according to the present invention, it is possible to provide a device with low power and high performance and a sensor node using the device.

BRIEF DESCRIPTION OF DRAWINGS

FIG. 2A is a power versus time graph of a device based on a conventional CMOS-based configuration;
FIG. 2B is a power versus time graph of the device in FIG. 2A with power-gating;
and FIG. 2C is a power versus time graph of the device in FIG. 2A with power-gating using a nonvolatile memory instead of a volatile memory;
FIG. 3A is a power versus time graph illustrating a case where a sequential process is performed on a CPU under power-gating;
FIG. 3B is a power versus time graph illustrating a case where a certain process is performed by an FPGA incorporated in the device;

FIG. 4 is a configuration diagram to illustrate a system with sensor nodes;

FIGS. 10A to 10F are diagrams illustrating each state;

FIG. 11A is a case in which a 16-bit instruction assigned to consecutive memory addresses; FIG. 11B is a case in which a 32-bit instruction assigned to consecutive memory addresses;

FIG. 33 is a table comparing the present example with conventional examples (Non Patent Literatures 1 to 5);

DESCRIPTION OF EMBODIMENTS

Hereinafter, embodiments of the present invention will be described in detail with reference to the accompanying drawings. Variations and modifications related to the description of the embodiment can be made without departing from the scope of the present invention.

Figure 1:
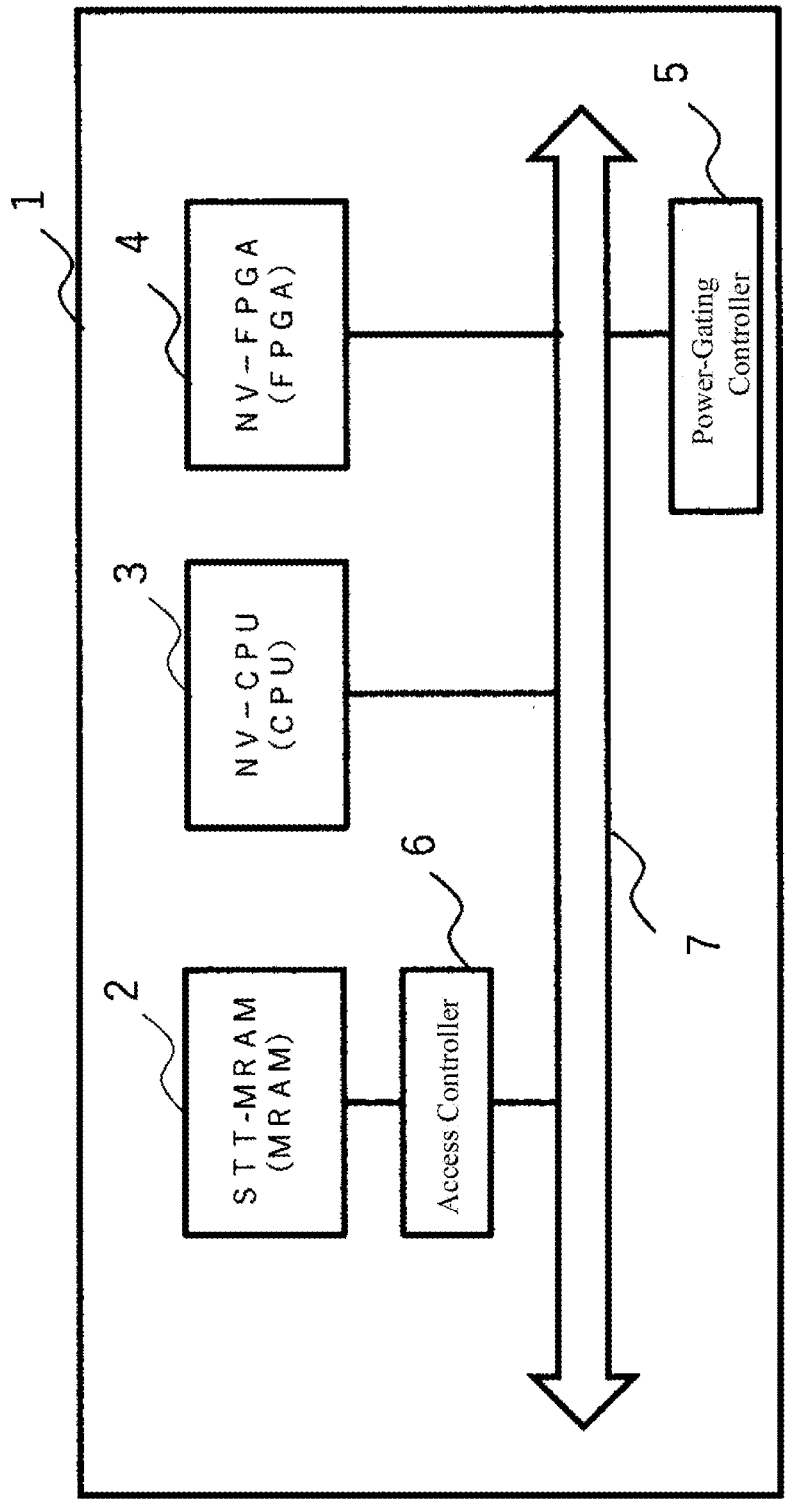
FIG. 1 is a configuration diagram to illustrate a device according to an embodiment of the present invention.

FIG. 1 is a configuration diagram to illustrate a device according to an embodiment of the present invention. As shown in FIG. 1, device 1 according to the embodiment of the present invention is configured to include an STT-MRAM (Spin Transfer Torque-Magnetoresistive Random Access Memory) 2 as an MRAM; an NV-CPU (Nonvolatile Central Processing Unit) 3; an NV-FPGA (Nonvolatile Field-Programmable Gate Array) 4; a power gating controller 5 that controls power supply to each memory cell in STT-MRAM 2, NV-CPU 3, and NV-FPGA 4; and a access controller 6 that reads data from STT-MRAM 2 and stores the data in advance of reading, controlling an access to STT-MRAM 2. Access controller 6 is provided as an intervention in access to STT-MRAM 2, and these modules are connected with bus 7.

In device 1 according to the present invention, specifically, in the MCU (Microcontroller Unit), NV-CPU 3 transmits data to STT-MRAM 2, allowing NV-FPGA 4 to read the data from STT-MRAM 2; and NV-FPGA 4 transmits data to STT-MRAM 2, allowing NV-CPU 3 to read the data from STT-MRAM 2. That is, the following operations are performed: STT-MRAM 2 stores the results computed by NV-CPU 3; using the results stored in STT-MRAM 2, NV-FPGA 4 further performs computing and returns the results to STT-MRAM 2; and NV-CPU 3 receives from STT-MRAM 2 the results computed by NV-FPGA 4.

In the embodiment of the present invention, it is possible to provide a microcomputer appropriate for a sensor node and the like which enables both high performance (for example, operating frequency of about 200 to 300 MHz) and low power consumption (for example, no more than 100 μW). As for the low power consumption, using a nonvolatile memory other than an MRAM may have a certain effect because it can reduce the standby power. However, in a case where a nonvolatile memory other than an MRAM is used, high-speed data-writing or -reading is impossible.

Thus, to achieve high performance with several hundred MHz operating frequency, in the embodiment of the present invention, in the MCU as device 1, an MRAM, preferably, STT-MRAM 2 is employed for a region to store data related to computing by the CPU and the FPGA.

Device 1 may be referred to as a nonvolatile microcomputer chip, a nonvolatile microcomputer, or a nonvolatile microcontroller unit.

STT-MRAM 2 is configured to include multiple memory cells separated into multiple regions including selection transistors and MTJs (Magnetic Tunneling Junctions). Preferably, STT-MRAM 2 is configured with multiple sub-array blocks and each of the blocks has a switch to turn ON/OFF the power from a power supply unit, not shown in the figure.

Power gating controller 5 allows STT-MRAM 2 to be power-gated per block division. Here, the block division is a separated block in the multiple regions in the MRAM; in FIG. 9, it refers to MRAM sub-arrays that constitute of MRAM 0 and MRAM 1.

In NV-CPU 3, the memory installed in the module is constituted of only nonvolatile memories. NV-CPU 3 has a switch to turn ON/OFF the power for the whole module from a power supply unit, not shown in the figure. Since NV-CPU 3 is constituted of nonvolatile memories, it is unnecessary to back up or write data in the CPU when the switch is turned ON/OFF (that is, whenever power-gated), and power-gating control can be performed. Naturally, since no data is backed up or written, there is no power consumption. It is especially effective in a device that intermittently executes a certain number of operations and enters into a standby state between processes, especially in an IoT sensor node, because no data back up or writing is required in power-gating control.

NV-FPGA 4 is configured to include a nonvolatile memory. Each tile in NV-FPGA 4 has a switch for power-gating, which enables to turn ON/OFF the power from a power supply unit, not shown in the figure. In addition, when a DSP is installed in NV-FPGA 4, the DSP has a switch to turn ON/OFF the power from a power supply unit to the DSP, not shown in the figure. Since NV-FPGA 4 is configured to include a nonvolatile memory, it is unnecessary to back up or write data in the FPGA when the switches are turned ON/OFF (that is, whenever power-gated), and also unnecessary to save or write configuration data. No need for backing up or writing data and the configuration data means no power consumption for that. A conventional device installed with a volatile FPGA and without a nonvolatile FPGA requires backing up and writing data and the configuration data whenever power-gated. However, the embodiment of the present invention, in which an FPGA is nonvolatile, does not require backing up or writing data and the configuration data whenever power-gated.

Power gating controller 5 controls power supply to each MRAM sub-array in STT-MRAM 2, NV-CPU 3, and each tile and a DSP in NV-FPGA 4 and supplies power only to the designated modules in operation.

Here, in STT-MRAM 2, each memory cell is preferably configured with 2T-2MTJ including two selection transistors and two MTJs. The STT-MRAM includes 1T-1MTJ, 2T-2MTJ, and 4T-4MTJ. In order to perform power-gating, the 4T-4MTJ requires peripheral equipment for power-gating which causes power consumption, thus, unpreferable. On the other hand, the 1T-1MTJ and the 2T-2MTJ, are suitable because their cell configurations themselves have a power-gating function; and in order to enhance the performance, the 2T-2MTJ is more preferable from the view of the number of bits. In addition, 2T-2MTJ provided with WL, BL, /BL, SL, and /SL in each cell may be sufficient, however, 2T-2MTJ provided with WL, BL, /BL, and SL in each cell where SL and/SL are shared is the most preferable because it can suppress the lay-out size. Further, it can adjust the writing pulse width in response to writing characteristics of the MTJ, which can suppress the writing current to optimize it.

Figures 2A, 2B, 2C:
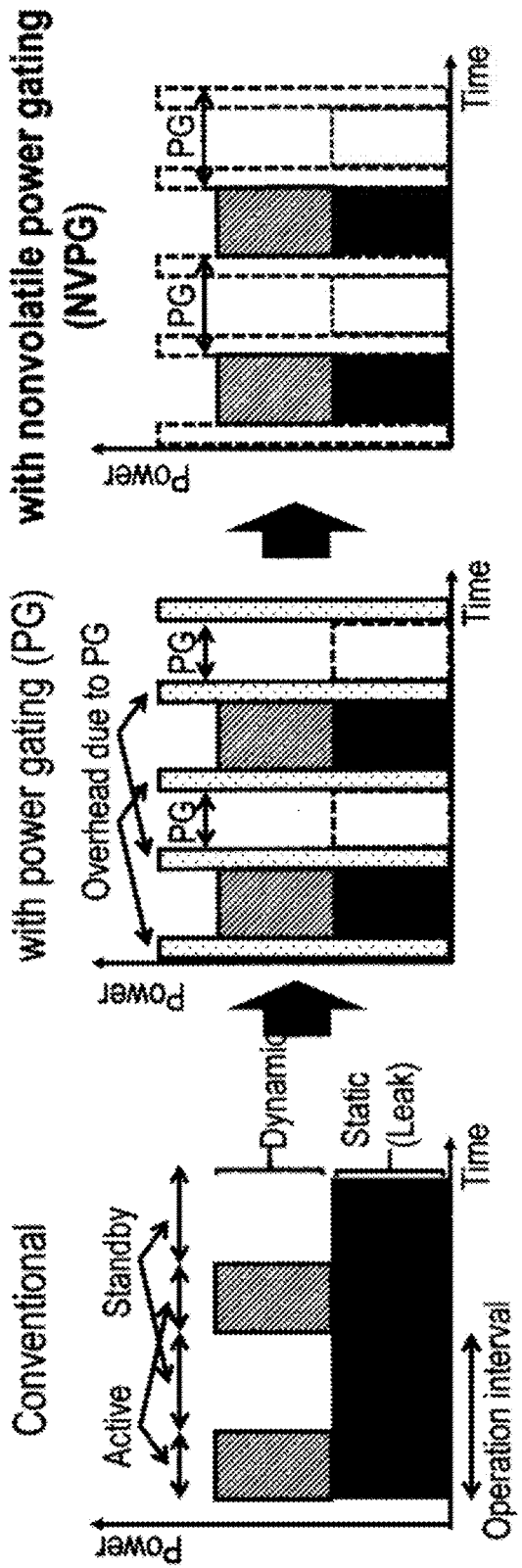
FIGS. 2A to 2C are graphs to illustrate a concept of the present invention.

A concept of device 1 according to an embodiment of the present invention will be described. FIGS. 2A to 2C are graphs to illustrate a concept of the present invention; FIG. 2A is a power versus time graph of a device based on a conventional CMOS-based configuration. When in active, the power is the sum total of dynamic and static power. When in standby, some static power is consumed. In the case with power-gating, as shown in FIG. 2B, the static power is consumed only when dynamic power is consumed; and static power is not consumed when dynamic power is not consumed. However, additional power is consumed before and after being in active state to back up data in a volatile memory and to write the data into the volatile memory. Therefore, in the case a nonvolatile memory is used instead of a volatile memory, as shown in FIG. 2C, the data back up or writing, required in FIG. 2B, are unnecessary.

Thus, this embodiment of the present invention can be implemented by using nonvolatile memories for all modules in device 1. A usual IoT sensor node intermittently executes a certain number of operations and enters into a standby state between processes. Conventional CMOS-based architectures use volatile internal memories, which require data transfer between internal and external memories to back up data before turning off the power. The embodiment does not require the data back up. In addition, a device in which only nonvolatile memories are used for all modules (MCU) does not require external memories and does not need to transfer the stored data. Therefore, the power-gating technique can be effectively applied at a granular level and can actively cut wasteful power consumption. As NV-FPGA 4 is configured to include a nonvolatile memory, it is unnecessary to back up or write data in the FPGA whenever power-gated, and unnecessary to back up or write the configuration data. It is especially effective in a device that intermittently executes a certain number of operations and enters into a standby state between processes, especially in an IoT sensor node, because no data back up or writing is required in power-gating control.

Figure 3B:
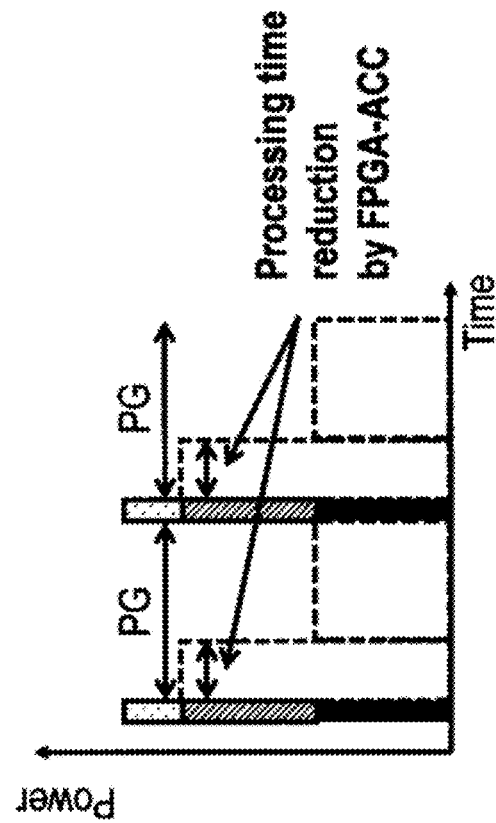
FIGS. 3A and 3B are graphs to illustrate a concept of the present invention.
Figure 3A:
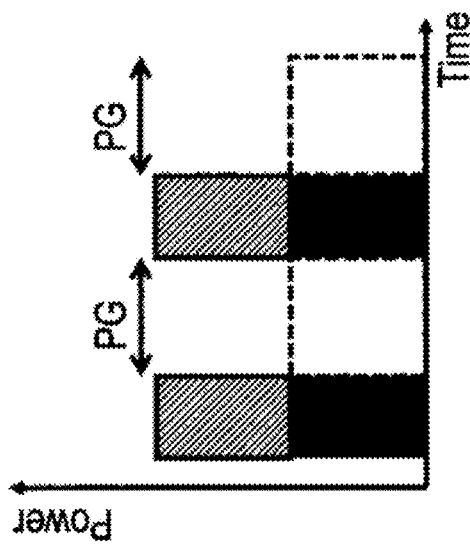

FIGS. 3A and 3B are graphs to further illustrate a concept of the present invention. As shown in FIG. 3A, a sequential processing on the CPU can only reduce power consumption of power-gating. However, as shown in FIG. 3B, operations are accelerated by performing a part of operations on the CPU by an FPGA incorporated in the device, which enhances the performance. Thus, a sequential process (processing in order according to the sequence) in each operation interval is parallelly performed by the CPU and an FPGA-based accelerator (FPGA-ACC). Since the parallel processing significantly reduces the processing time (see "processing time reduction by FPGA-ACC" in FIG. 3B), the duration of power gating (PG) becomes longer. As a result, both the static and dynamic power portions in the increased time of power gating by parallel processing, i.e., the time of the process time reduced by FPGA-ACC, become unnecessary. This removed unnecessary power is far greater than the increased power consumption due to the computing of the FPGA-ACC. Thus, to install an FPGA-ACC to a nonvolatile microcomputer configured with a NV-CPU and an MRAM can realize high computing performance and low power consumption. A shorter processing time can reduce the operating time of the MRAM, which consumes most of the power, thereby, achieving further lower power consumption. When NV-FPGA 4 can be connected to NV-CPU 3 with bus 7, sequential processing can be parallelly processed by NV-CPU 3 and NV-FPGA 4. In an IoT sensor node, in particular, as described later with reference to FIGS. 4 and 5, it is preferable to suppress data amount in the terminal end sensor node 110, for example, by obtaining a feature value or processing an image, and to transmit the data to a higher unit, cloud system 140 in order to avoid processing of the sensor data in cloud system 140. In the embodiment of the present invention, NV-CPU 3 and NV-FPGA 4 parallelly performs sequential processing, which enables high computing performance and low power consumption. It is preferable to be applied to an IoT sensor node.

Thus, it can reduce a sequential processing time between operation intervals, and enables further power-saving. Here, an FPGA configures an MTJ on a CMOS, enabling a nonvolatile FPGA with super low power consumption.

As described above, a concept of the present invention is to realize a microcomputer appropriate for a sensor node and the like, which enables both high performance (for example, operating frequency of about 200 to 300 MHz) and low power consumption (for example, no more than 100 µW). As for the low power consumption, using a nonvolatile memory other than an MRAM may have a certain effect because it can reduce the standby power. However, in a case where a nonvolatile memory other than an MRAM is used, it is impossible to realize both high-speed data-writing and -reading and computing performance with several hundred MHz operating frequency. On the other hand, in a case where an MRAM is used, it is possible to realize high-speed performance with high-speed writing and reading function and low-power consumption by using nonvolatile memories, simultaneously. Thus, it exerts a great effect on a microcomputer as a device configured with an NV-CPU, an NV-FPGA, and an MRAM memory according to an embodiment of the present invention.

Thus, in order to realize a microcomputer with both high performance and low power consumption appropriate for a sensor node, implementation of an MRAM as a memory to a microcomputer installed with a CPU and an FPGA requiring a high computing performance exerts a great effect.

Figure 5:
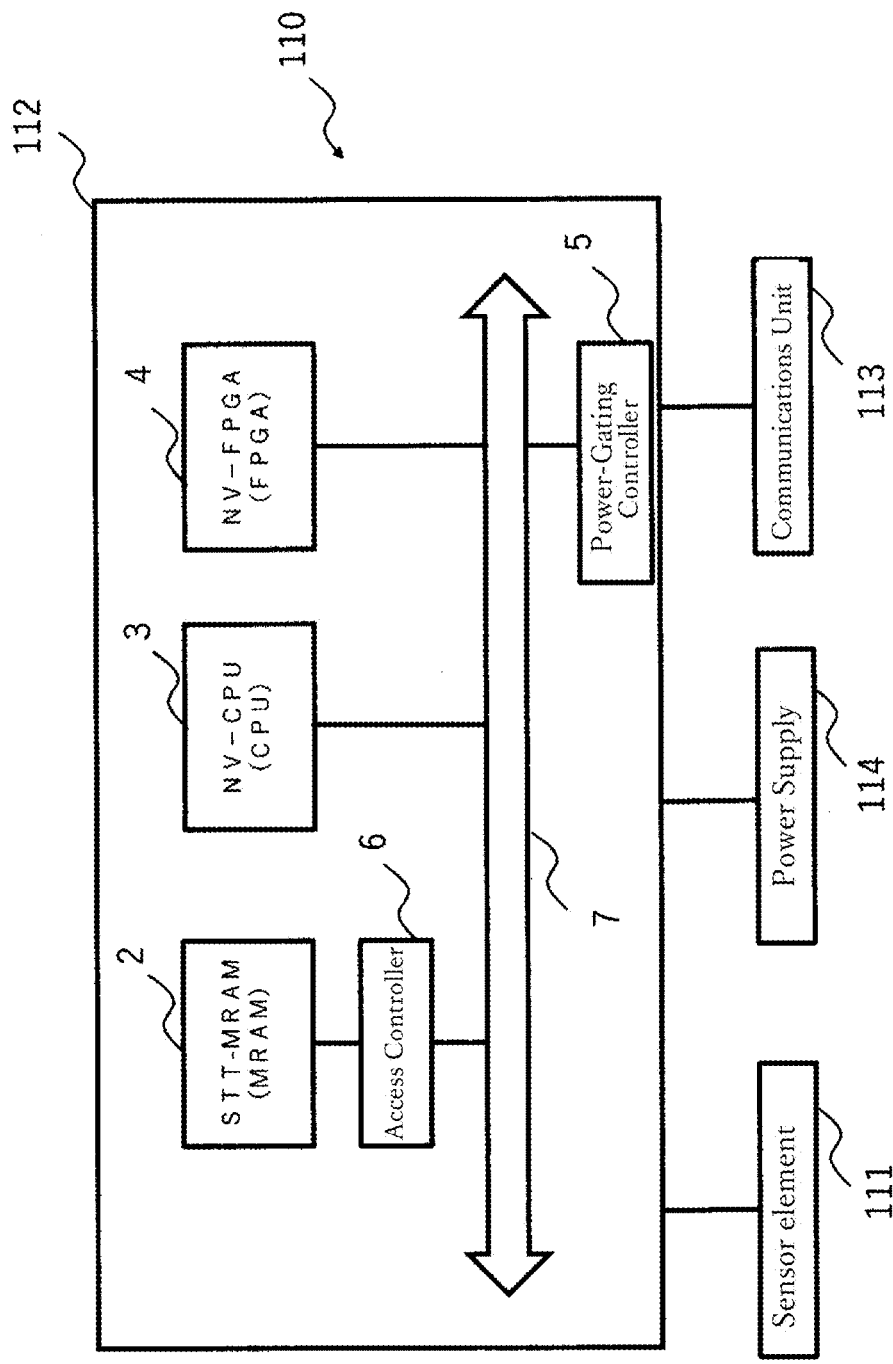
FIG. 5 is a configuration diagram to illustrate a sensor node.

Next, a sensor node using the device in FIG. 1 and a system using it will be described. FIG. 4 is a configuration diagram to illustrate a system with sensor nodes; FIG. 5 is a configuration diagram to illustrate a sensor node. System 100 includes: one or more sensor nodes 110 to be installed in an indoor or outdoor structure or mounted on people or animals; a gateway (GW) 120 to connect one or more sensor nodes 110 to communications network 130 such as the Internet; and a higher unit such as a cloud system 140 to store and process various information transmitted from one or more sensor node 110 via communications network 130.

The sensor node 110 includes: a sensor element 111 to measure various physical quantity; an MCU 112 to process data from sensor element 111 into information; a communications unit 113 to output the information processed by MCU 112 and various control data to the outside; and a power supply 114 to convert natural energy, artificial vibrations, and the like, into power and store it.

MCU 112, a device with a configuration shown in FIG. 1, can process data with low power and it is unnecessary to process sensor data by cloud system 140. MCU 112 can suppress data amount in the terminal end sensor node 110, for example, by obtaining a feature value or processing an image, and to transmit the data to a higher unit, cloud system 140; and thus, it can significantly lower traffic amount.

Figure 6:
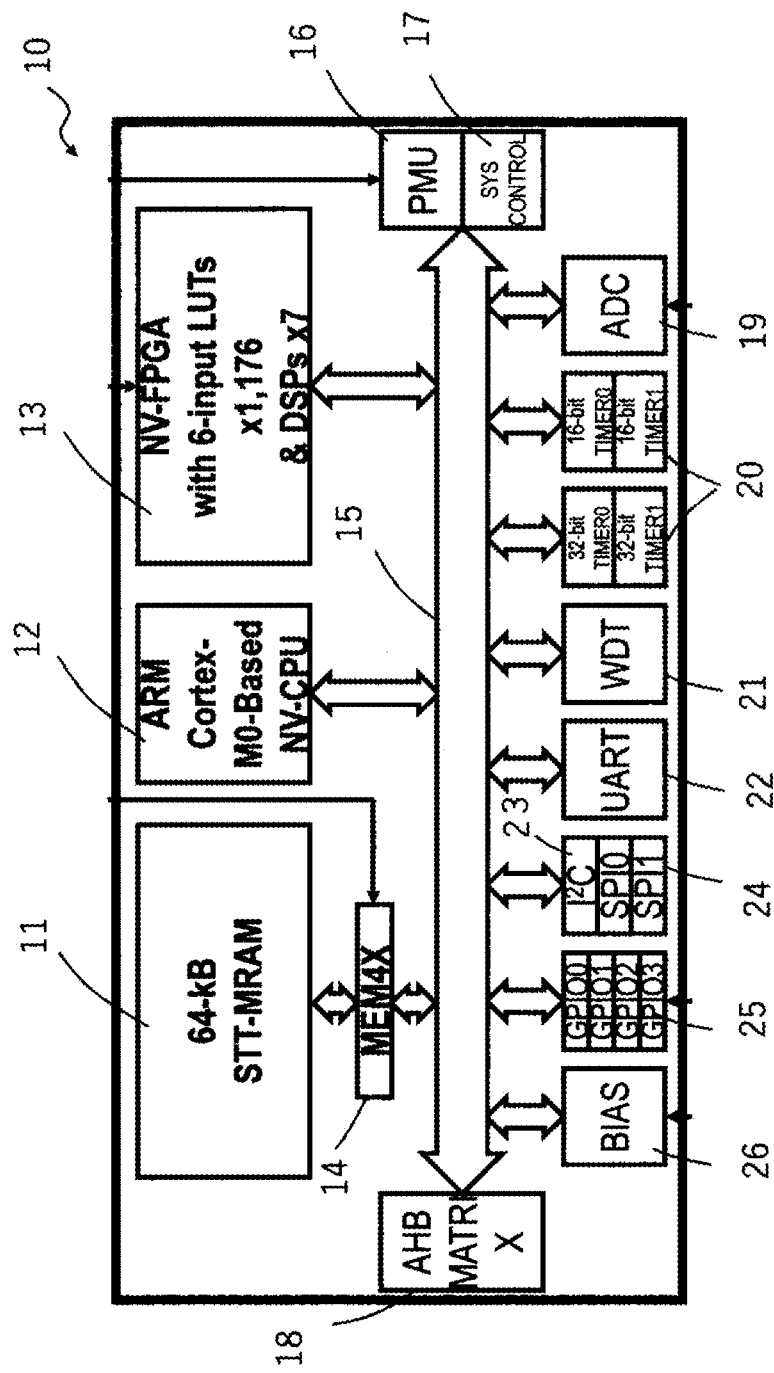
FIG. 6 is a configuration diagram embodying FIG. 1.

Next, a concrete configuration of device 1 will be explained. FIG. 6 is a configuration diagram embodying FIG. 1. As shown in FIG. 6, an MCU 10 as a device includes: an STT-MRAM 11; an NV-CPU 12; an NV-FPGA 13; an MEM4X access controller 14; a bus 15; a PMU (Performance Monitoring Unit) 16; a system control (SYS CONTROL) 17; a bus matrix (AHB-MATRIX) 18; and peripheral equipment of a CPU in the MCU including: an ADC (Analog-Digital Converter) 19; a timer 20; a WDT (watchdog timer) 21; a UART (Universal Asynchronous Receiver/Transmitter) 22; a serial bus (for example, PC) 23; an SPI (Serial Peripheral Interface) 24; a GPIO (General-Purpose Input/Output) 25; and a BIAS 26. The peripheral equipment as a CPU is an example; another configuration is possible.

Figure 7:
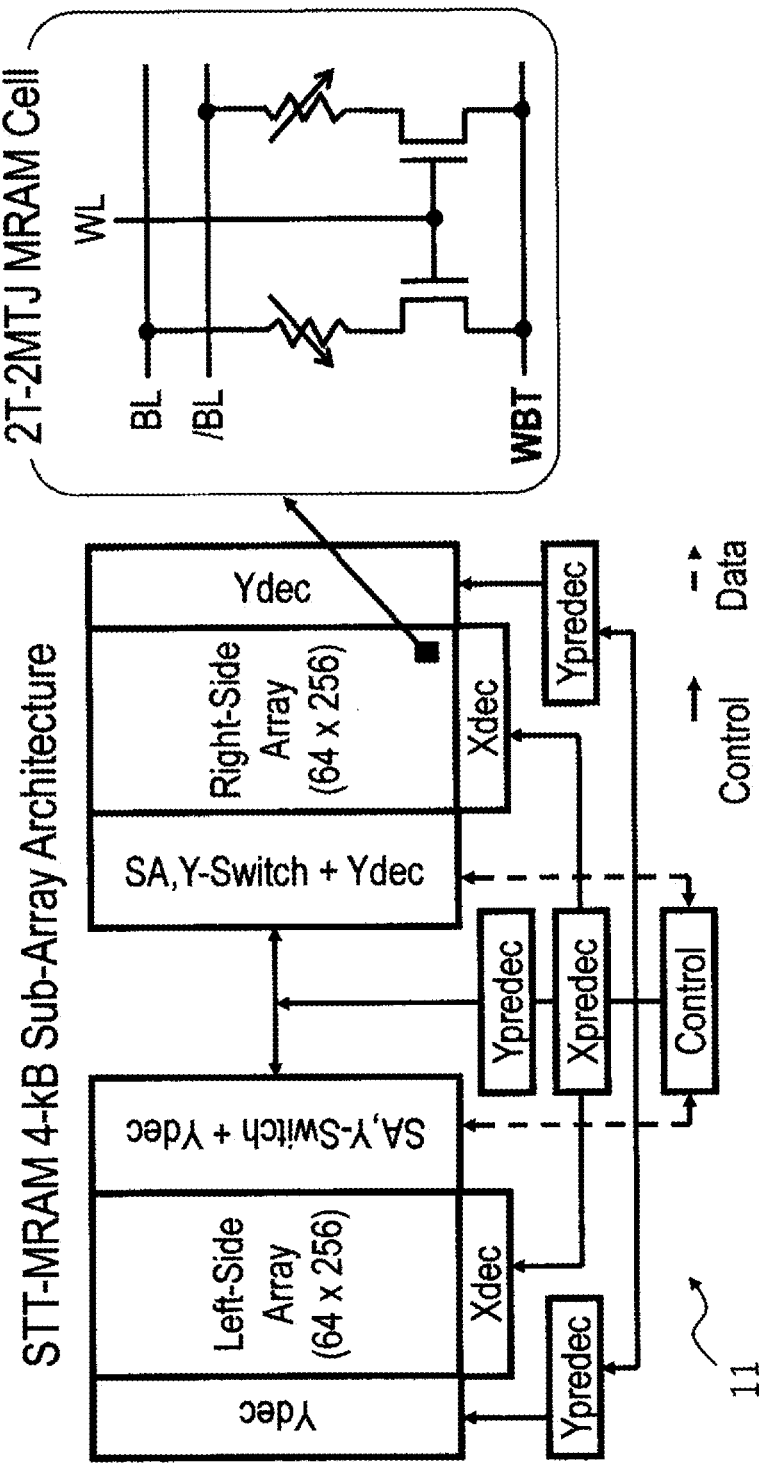
FIG. 7 is a specific configuration diagram to illustrate an STT-MRAM.

FIG. 7 is a specific configuration diagram to illustrate STT-MRAM 11. As shown in FIG. 7, STT-MRAM 11 includes: a left-side array constituted of MRAM sub-arrays; and a right-side array similarly constituted of MRAM sub-arrays, and the MRAM itself is controlled by Control. In order to access data stored in a specified address of memories, the location (coordinates) of the memory cell with the data stored is specified on the basis of an input data address. In Xpredec and Ypredec, a signal corresponding to the coordinates indicating the location of the memory cell is generated on the basis of the address; the signal is converted into a complement signal and the like required for an actual access in Xdec and Ydec; and then the access to the subject memory cell is executed. Thus, conversion from an address to a memory location is performed in two stages.

Ydec is arranged at both left and right sides of the left-side array and the right-side array because an operation to read memory data is different in left and right. The outer Ydec flows a constant current into a reading-subject memory cell and generates a voltage signal corresponding to a cell state (or, a resistance state of the MTJ). The voltage signal is amplified by a sense amplifier (SA) attached to the inner Ydec and data are extracted from the reading-subject memory cell. In the diagram, a solid arrow represents a control signal and a dotted arrow represents a data signal.

STT-MRAM 11 is not provided with a switch for power-gating because there is no power supply line in each memory cell.

As shown in the right side of FIG. 7, a left and right shared type WBT is used for each cell in STT-MRAM 11, therefore, the cell area can be reduced.

Figure 8:
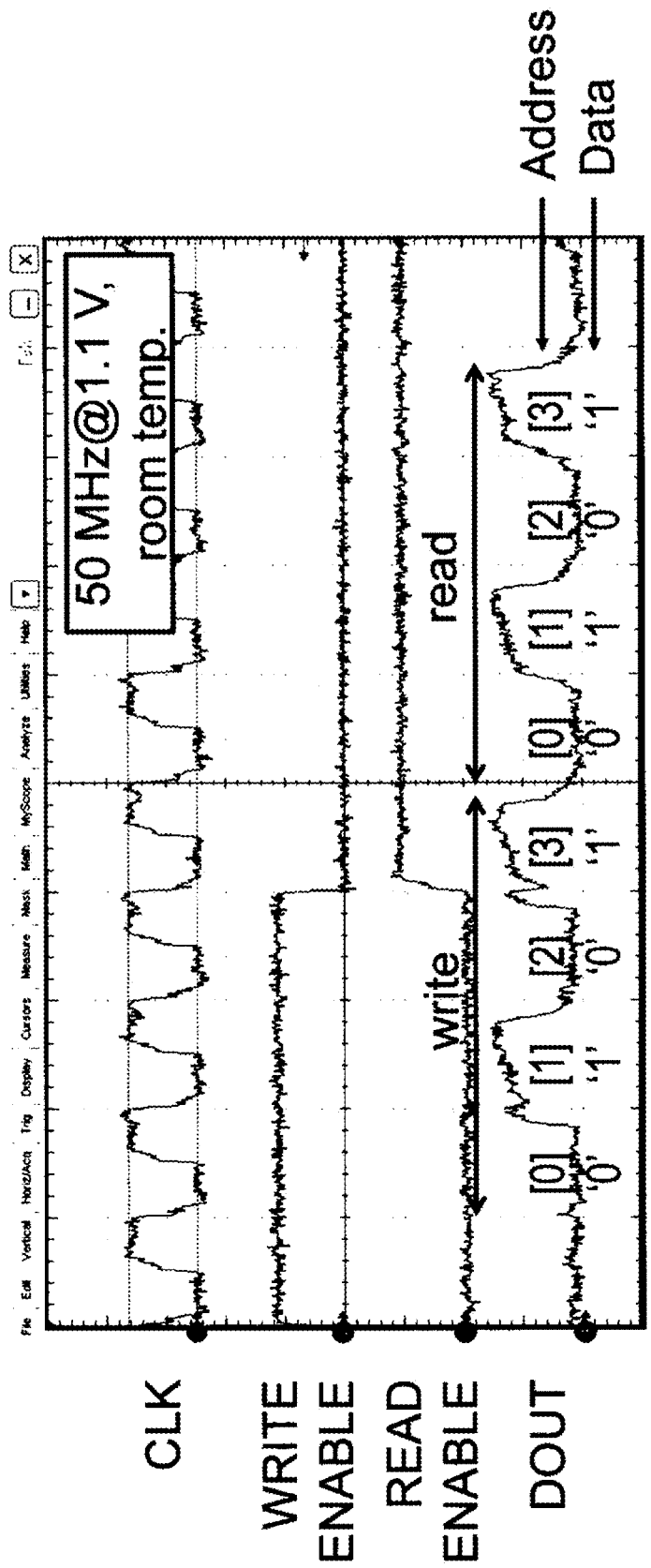
FIG. 8 is a diagram to illustrate an operation waveform of the STT-MRAM.

FIG. 8 is a diagram to illustrate an operation waveform of STT-MRAM 11. For the clock (CLK), data are written by the Write enable signal and read by the Read enable signal.

As described with reference to FIG. 1, access controller 6 receives a data-reading instruction from NV-CPU 3 and determines whether or not the data have been read from STT-MRAM 2 in advance, and if the data have been already read, access controller 6 transmits the stored data to NV-CPU 3. Specifically speaking, access controller 6 includes: an address-storing register, a multiplexer, multiple data-storing registers, and a comparator, not shown in FIG. 1. Access controller 6 receives from NV-CPU 3 an input about an address in STT-MRAM 2 that is a reading destination and stores the address in the address-storing register. The multiplexer reads multiple destinations of STT-MRAM 2 specified in the address and stores the data read from STT-MRAM 2 in each data-storing register. Access controller 6 receives a new reading instruction together with a specified reading destination from NV-CPU 3, compares an address stored in the address-storing register with the reading destination address by using the comparator, and determines whether or not the reading destination address has been read from STT-MRAM 2 in advance, and if it has been already read and stored in a data-storing register, access controller 6 transmits the stored data to NV-CPU 3 in response to the reading instruction.

Figure 9:
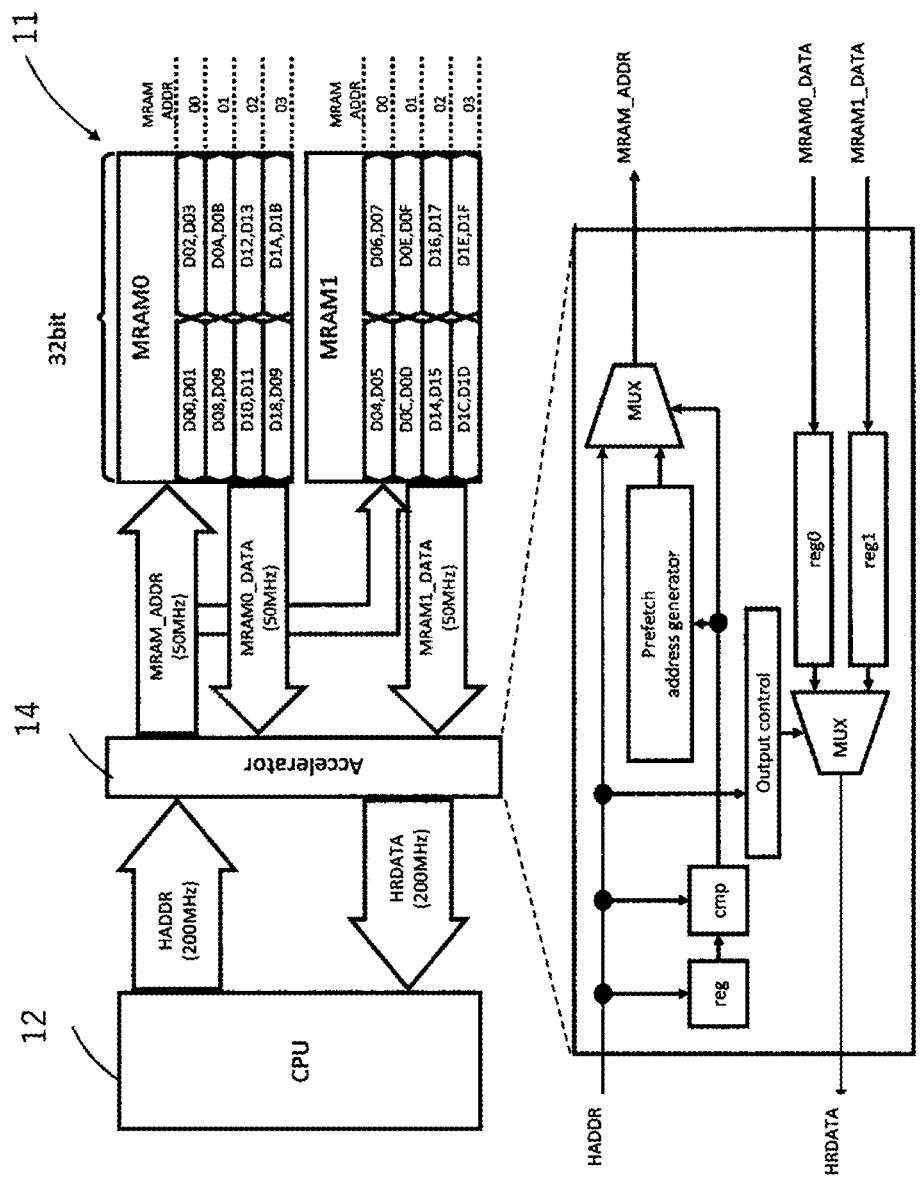
FIG. 9 is a diagram to illustrate an access controller (Accelerator) between the CPU and MRAMs.

FIG. 9 is a diagram to illustrate an access controller (Accelerator) 14 between the CPU and MRAMs. It includes both a 16-bit instruction and a 32-bit instruction. All data are 32-bit size. In FIG. 9, HADDR represents a memory address of MRAM 11, accessed by CPU 12, and HRDATA represents data stored in the accessed address. Access controller (Accelerator) 14 includes: a register (reg) to store HADDR; a comparator (cmp) to compare the HADDR with the next HADDR; a prefetch address generator; a MUX (Multiplexer) to select either HADDR or an output from an address generator and output it; registers (reg 0, reg 1) to store data read from MRAM 11; and another MUX (Multiplexer) to select any read data and output it. Here, "prefetch" means to capture, or fetch, data in advance of the timing to actually use it. As shown in FIG. 9, an arrow from an upper or lower side of the circuit block is a controlled input that is "0" or "1", and MUXs have a function to select one of two inputs, either from left or right depending on the value "0" or "1", and output it as is.

Thus, access controller 14: includes an address-storing register (reg) provided at an input side of STT-MRAM 11, which receives an input about an address in STT-MRAM 11 that is a reading destination and stores the address; a multiplexer (Multiplexer) that reads multiple destinations of STT-MRAM 11 specified in the address-storing register (reg); multiple data-storing registers (reg 0, reg 1) that store data read from STT-MRAM 11; and a comparator (cmp) that receives a reading instruction together with a specified reading destination and compares an address with an reading destination address stored in the address-storing register (reg).

The data address to be used is passed from CPU 12 to access controller (Accelerator) 14 via HADDR; at that time, the address is stored in the left side register (reg) in the Accelerator of FIG. 9. The right side MUX in the Accelerator compares the data passed from HADDR with the data stored in reg, and if they do not correspond to each other, the right side MUX regards the HADDR value as an MRAM ADDR value, read data for two 16-bit instructions (16-bit× 2=32-bit, two of them in parallel for one MRAM) in one time from both MRAM 0 and MRAM 1, and store them into reg 0 and reg 1.

Figure 11A:
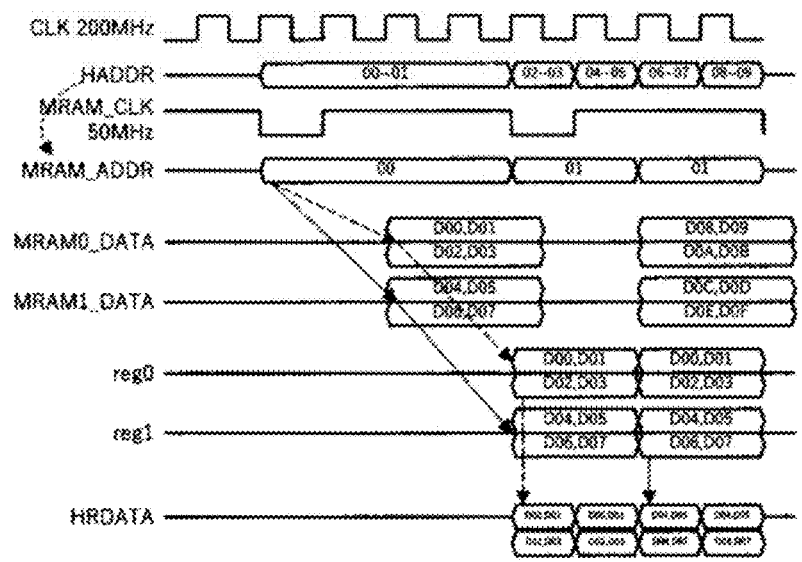
FIGS. 11A and 11B are examples to illustrate data flowchart.

In a case 16-bit instructions stored in the consecutive memory addresses are consecutively executed, data for four instructions are captured into reg 0 and reg 1 in one time by the above-described processing, therefore, the data passed from CPU 12 via HADDR is compared with the data stored in reg, and if the above-described conditions are satisfied, the data captured in reg 0 and reg 1 in advance and corresponding to the address specified in HADDR is specified by a computing unit, "Output control" in the FIG., then used as an output to HRDATA, or a reading instruction from CPU 12. At that time, in response to a reading instruction from CPU 12 via HADDR, data are not passed from MRAM 11 but from reg 0 or reg 1; therefore, data are not returned at a possible transfer speed between the Accelerator and the MRAM (for example, 50 MHz) but returned at a possible transfer speed between CPU 12 and the Accelerator (for example, 200 MHz). FIG. 11A illustrates a series of flow; values used here, such as 50 MHz, 200 MHz, are examples.

Figure 11B:
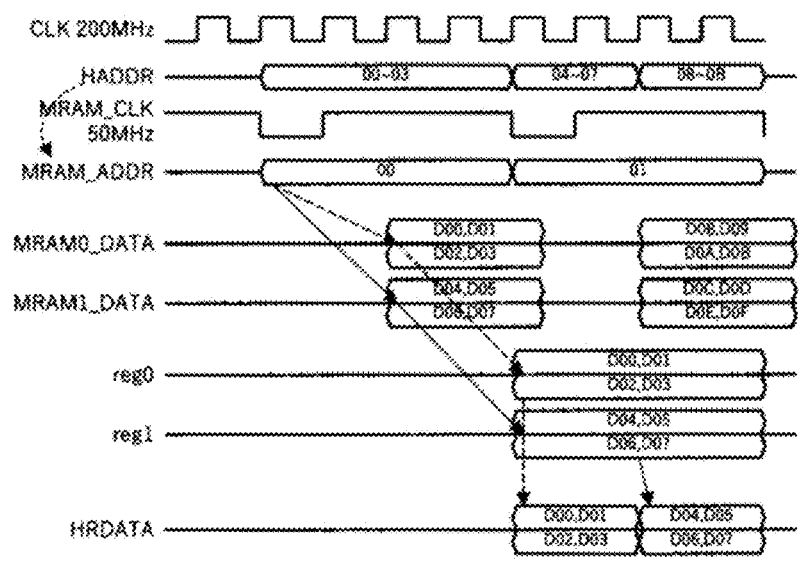

In a case 32-bit instructions stored in the consecutive memory addresses are consecutively executed, data for two instructions are captured into reg 0 and reg 1 in one time by the above-described processing, therefore, the processing same as the above is performed. In this case, the data is returned at 100 MHz. FIG. 11B illustrates a series of flow; a value used here, such as 100 MHz, is an example.

The access from CPU 12 to MRAM 11 is performed in multiplex and the read data are temporally saved in registers (reg 0, reg 1). If accesses to the same memory address are repeated, the data stored in registers is re-used instead of memory data. FIGS. 10A to 10F are diagrams to illustrate a transition example of data transfer in FIG. 9. A data request is executed before the CPU requires the data, and when the next instruction that is prepared for fetch is executed, the 16-bit instruction stored in the registers is performed. Thus, a high-speed instruction fetch is performed without interruption.

Figure 10A:
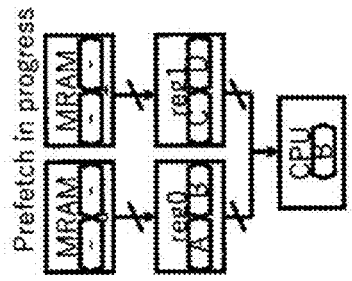
FIGS. 10A to 10F are diagrams to illustrate data transfer transition.
Figure 10B:
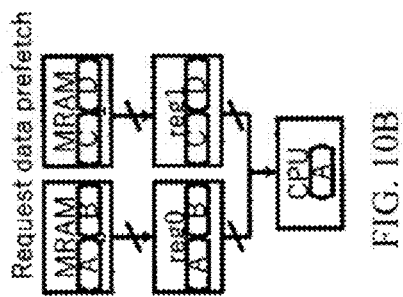
Figure 10C:
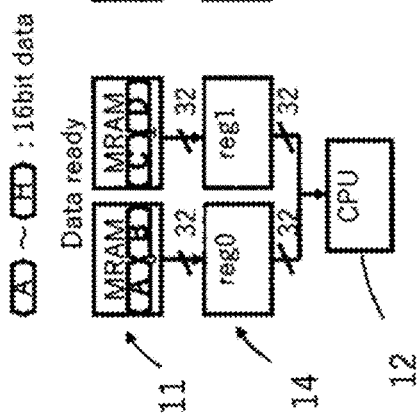
Figure 10D:
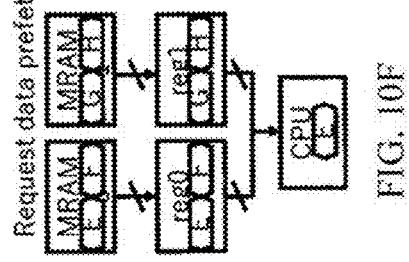
Figure 10E:
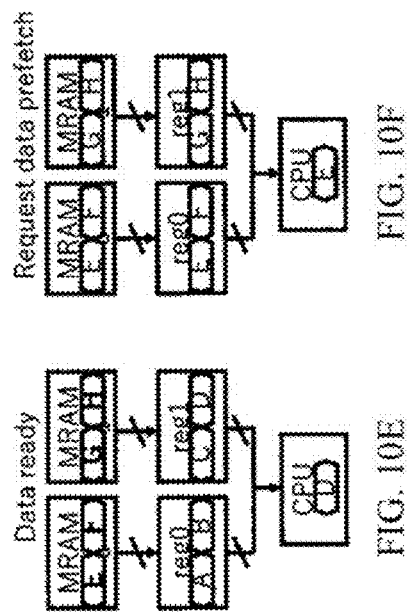
Figure 10F:
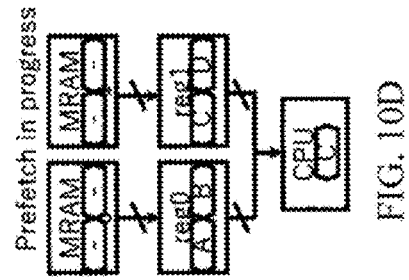

In FIGS. 10A to 10F, FIG. 10A illustrates an initial state. In FIG. 10B, a prefetch data request, data storage into a register in the access controller (accelerator circuit), and a fetch operation of instruction A are simultaneously executed. In FIG. 10C, a fetch operation of instruction B is executed. In FIG. 10D, a fetch operation of instruction C is executed. In FIG. 10E, a fetch operation of instruction D is executed and the prefetch data requested in FIG. 10B has been prepared at this time. In FIG. 10F, another prefetch data request, data storage into another register in the access controller (accelerator circuit), and a fetch operation of instruction E are simultaneously executed. As the fetch preparation of the instruction to be next executed has been completed in the previous state, an instruction fetch can be executed at high speed without interruption.

FIGS. 11A and 11B are examples to illustrate data flowchart; FIG. 11A is a case in which a 16-bit instruction assigned to consecutive memory addresses; FIG. 11B is a case in which a 32-bit instruction assigned to consecutive memory addresses. As shown in FIG. 11A, the 16-bit instruction assigned to consecutive memory addresses is fetched in series, enabling prefetch data for four instructions in advance, as shown in FIG. 11A, an instruction fetch can be executed four times faster than the access speed to the MRAM. In addition, the 32-bit instruction assigned to consecutive memory addresses can be executed two times faster than the memory access speed by interleaving and performing the same control to store data for two 32-bit instruction in a register, as shown in FIG. 11B. As a result, it is possible to conceal a bottleneck in the memory access and an instruction fetch can be appropriately executed at high speed depending on the length of a fetch instruction.

Thus, speed enhancement has been achieved by so-called best effort manner. The degree of actual performance improvement depends on the program to be executed. Specifically, it is possible even in a program in which memory accesses to random accesses due to conditional branching frequently occur; however, it is preferably effective in processing to execute a sequential processing such as an MCU for a sensor node application. In such processing, accesses to the memory are also regular, it therefore functions very effectively. As a result, similar effects to cache can be obtained without increasing the area or the power overhead.

Here, this access controller will be described in more detail. For example, a test chip for a nonvolatile VLSI processor using a 40 nm MOS/MTJ process has been fabricated. It can be designed by using an automatic design flow and a cell library for an MTJ-based NV-LIM LSI. An area overhead due to introduction of the accelerator circuit can be estimated as 13.6% on the basis of the number of gate in each block. Note that each block, separately designed for evaluation of overhead in this case, can be integrated and laid-out as one circuit block. In that case, the area overhead would be expected to be even smaller.

Figure 12:
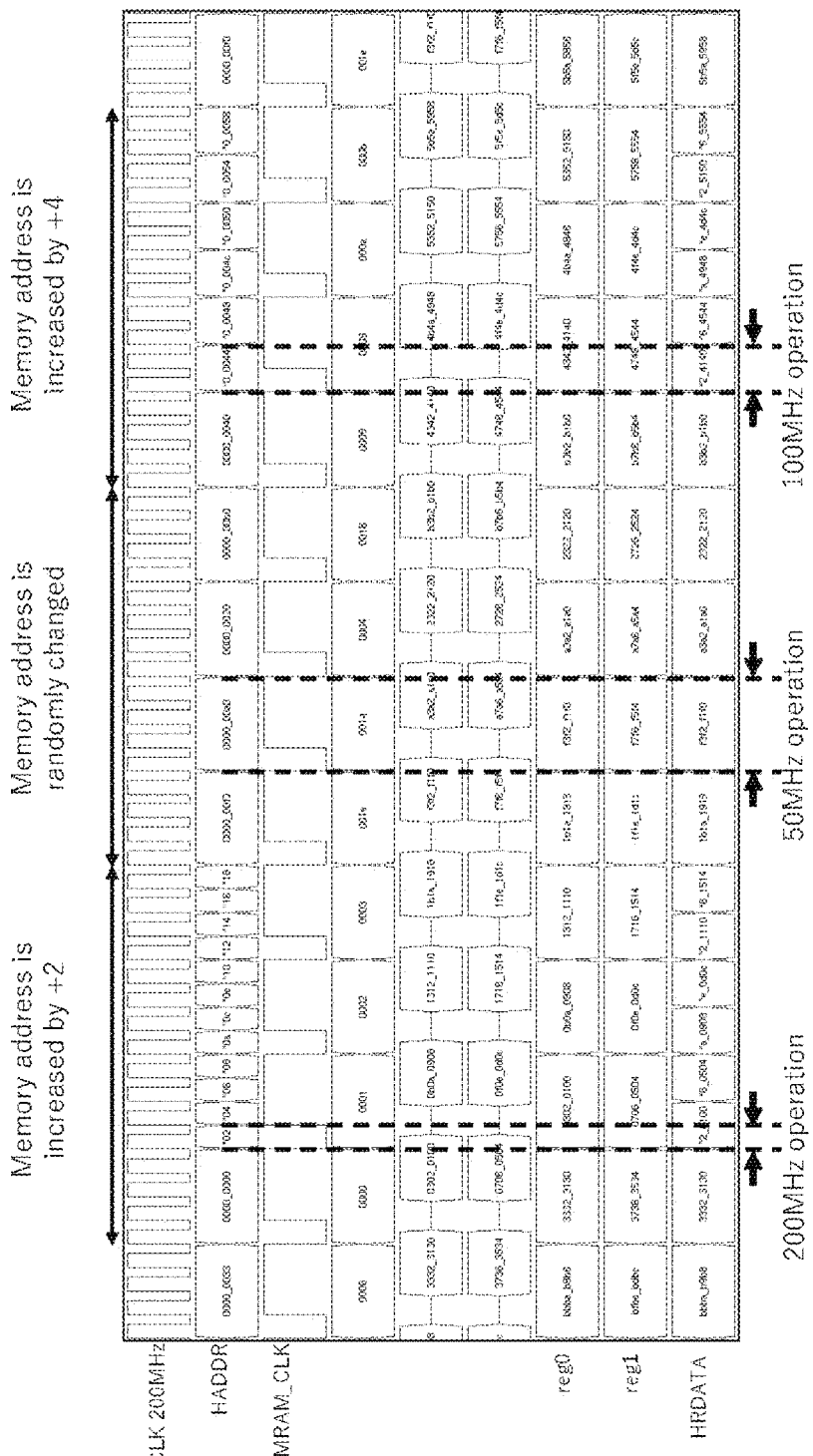
FIG. 12 is a diagram to illustrate a simulation waveform in an access controller.

FIG. 12 is a diagram to illustrate a simulation waveform in the access controller (accelerator circuit). In this example, the following instructions are sequentially executed: (1) a 16-bit instruction assigned to consecutive memory addresses; (2) a branch instruction to access to inconsecutive memory addresses; (3) a 32-bit instruction assigned to consecutive memory addresses. FIG. 12 reveals that an operating frequency dynamically changes from 50 MHz to 200 MHz depending on if transition of a memory address to be accessed satisfies conditions for instruction fetch acceleration.

Figure 13:
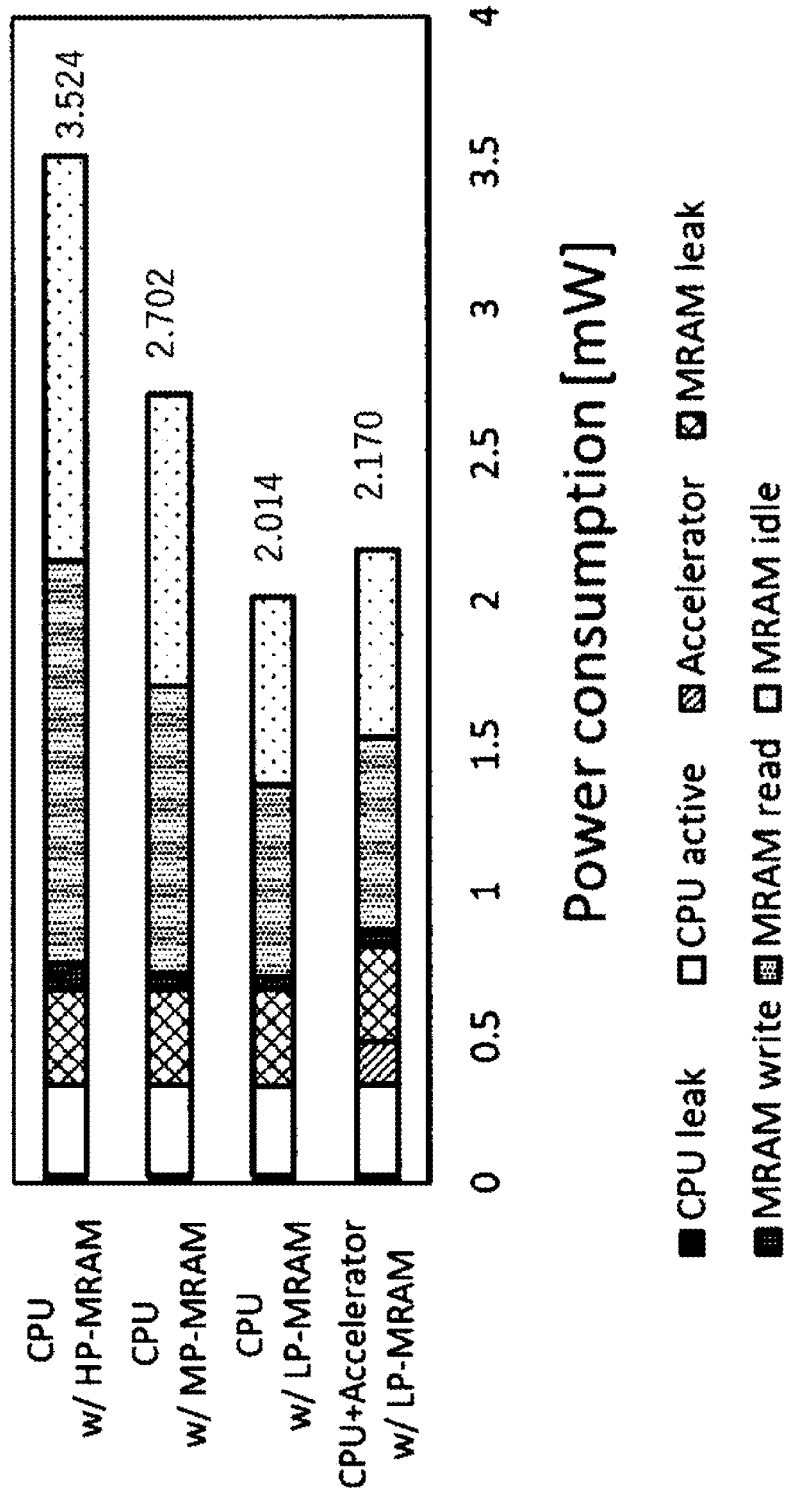
FIG. 13 is a chart to compare power consumption of a system configured with an access controller, an MRAM, and an NV-CPU with that of conventional systems.

FIG. 13 is a chart to compare power consumption of a system configured with a CPU incorporating the access controller (accelerator circuit) and an MRAM with that of conventional systems. Here, the effects to ease performance requirements for the MRAM have been checked as follows.

Low performance MRAM (LP-MRAM): reading/writing at 50 MHz.

Middle performance MRAM (MP-MRAM): reading/writing at 100 MHz

High Performance MRAM (HP-MRAM): reading/writing at 200 MHz.

Note that all the MRAMs are designed in the same manner.

FIG. 13 reveals that the MRAM consumes most of the total power consumption and that the higher performance is required, the more power the MRAM consumes. The access controller (accelerator circuit), which does not require change of performance requirements for the MRAM, can be used to enhance the system performance with only power overhead of the accelerator circuit.

Here, performances in the case with and without the accelerator circuit are compared. In the evaluation, an area, power consumption, and a processing performance are evaluated in three type of systems with MRAMS having different performances described above, a system with a cache, and a system with the accelerator circuit.

TABLE 1

| Performance | Conventional Example | | | | Present Example |
|---|---|---|---|---|---|
| | w/LP-MRAM | w/MP-MRAM | w/HP-MRAM | w = cache | w/LP-MRAM |
| Area ratio | 1.0 | 1.0 | 1.0 | 2.36 | 1.03 |
| Voltage (V) | 1.1 | 1.1 | 1.1 | 1.1 | 1.1 |
| Frequency (MHz) | 50 | 100 | 200 | 50/200 | 50/100/200 |
| Peak perf. (MIPS) | 49.56 | 99.12 | 198.24 | 198.24 | 198.24 |
| Power (mW) | 2.014 | 2.702 | 3.524 | 2.487 | 2.170 |
| Peak efficiency ratio | 1 | 1.49 | 2.29 | 3.24 | 3.71 |
| Temperature range (° C.) | 0-100 | 30-100 | 70-100 | 0-100 | 0-100 |

As shown in TABLE 1, in the implementations with middle or high performance MRAM, their efficiency decrease as the MRAM consumes more power, which narrows temperature range ensuring the operation. In the implementation with a cache, the performance could be expected to be higher; however, the area overhead becomes very large. On the other hand, in the implementation with the accelerator circuit, an accelerative unit can be embedded with a small overhead area and the operating frequency of the CPU can be accelerated without changing performance requirements for the MRAM. As a result, area efficiency can be improved. Thus, comparing with the implementation with a conventional cache, its performance efficiency (MIPS/mW) improves from 2.29 times to 3.71 times, and reading and writing operations can be ensured in a wide temperature range.

The performance of the access controller varies depending on programs that should be executed; however, it is revealed that a benchmark using some sample programs enables the access controller to perform at more than about 100 MHz even in a filter operation by relatively large capacity memory access, and that it very effectively performs in programs with relatively few memory accesses or branches.

Next, the NV-CPU will be explained. All the flip-flops used for the NV-CPU are MTJ-based nonvolatile flip-flops. Since they are nonvolatile, there is no need to back up data for power-gating.

Figure 14:
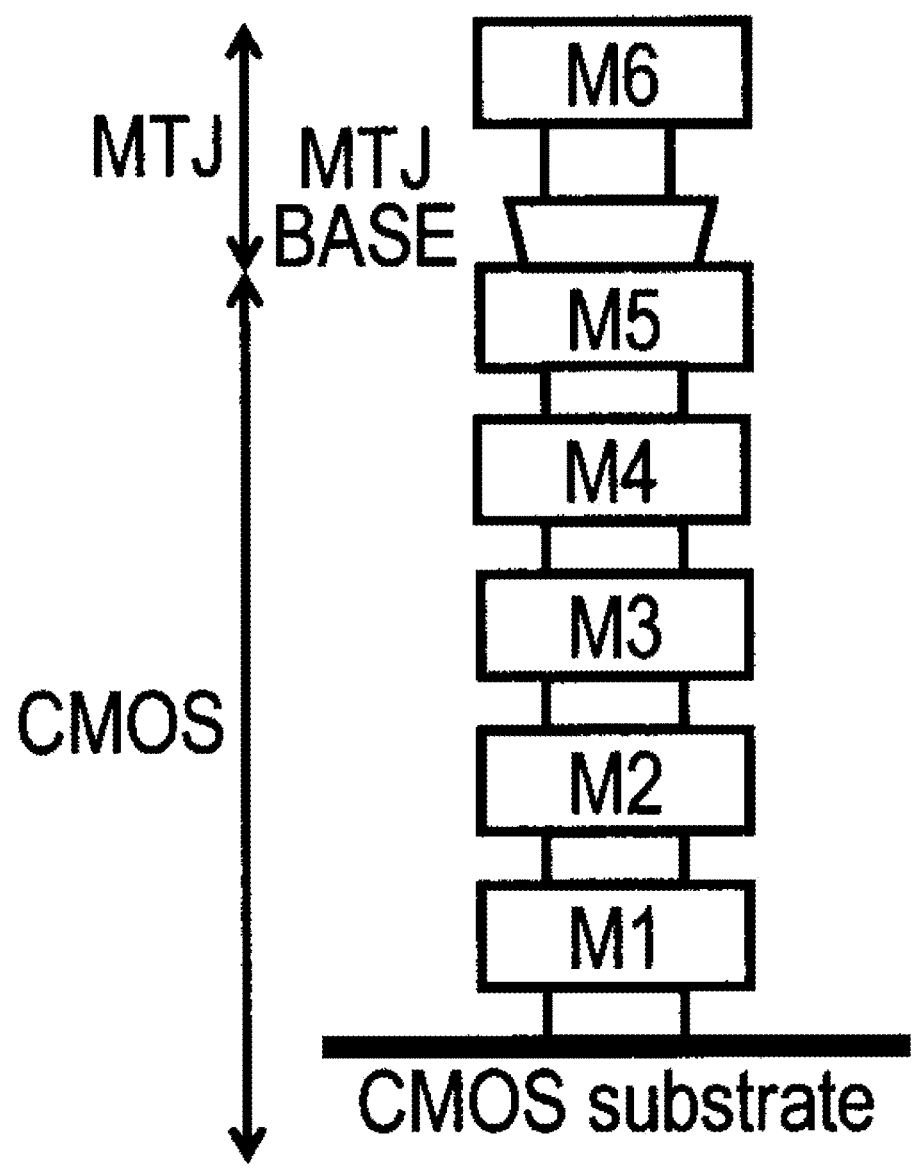
FIG. 14 is a cross-sectional view to illustrate an MTJ device used in the NV-CPU.

FIG. 14 is a cross-sectional view to illustrate an MTJ device used in the NV-CPU. The MTJ device is embodied by the configuration of an MTJ provided above a CMOS substrate, the MTJ is formed by providing a pin layer, a barrier layer, and a free layer on the top metal layer on which CMOS is formed. An MTJ element has two different resistances depending on the spin direction. The MTJ element can maintain a resistance state without continuous power supply. Therefore, the MTJ device can be used as a 1-bit nonvolatile memory.

Figure 15:
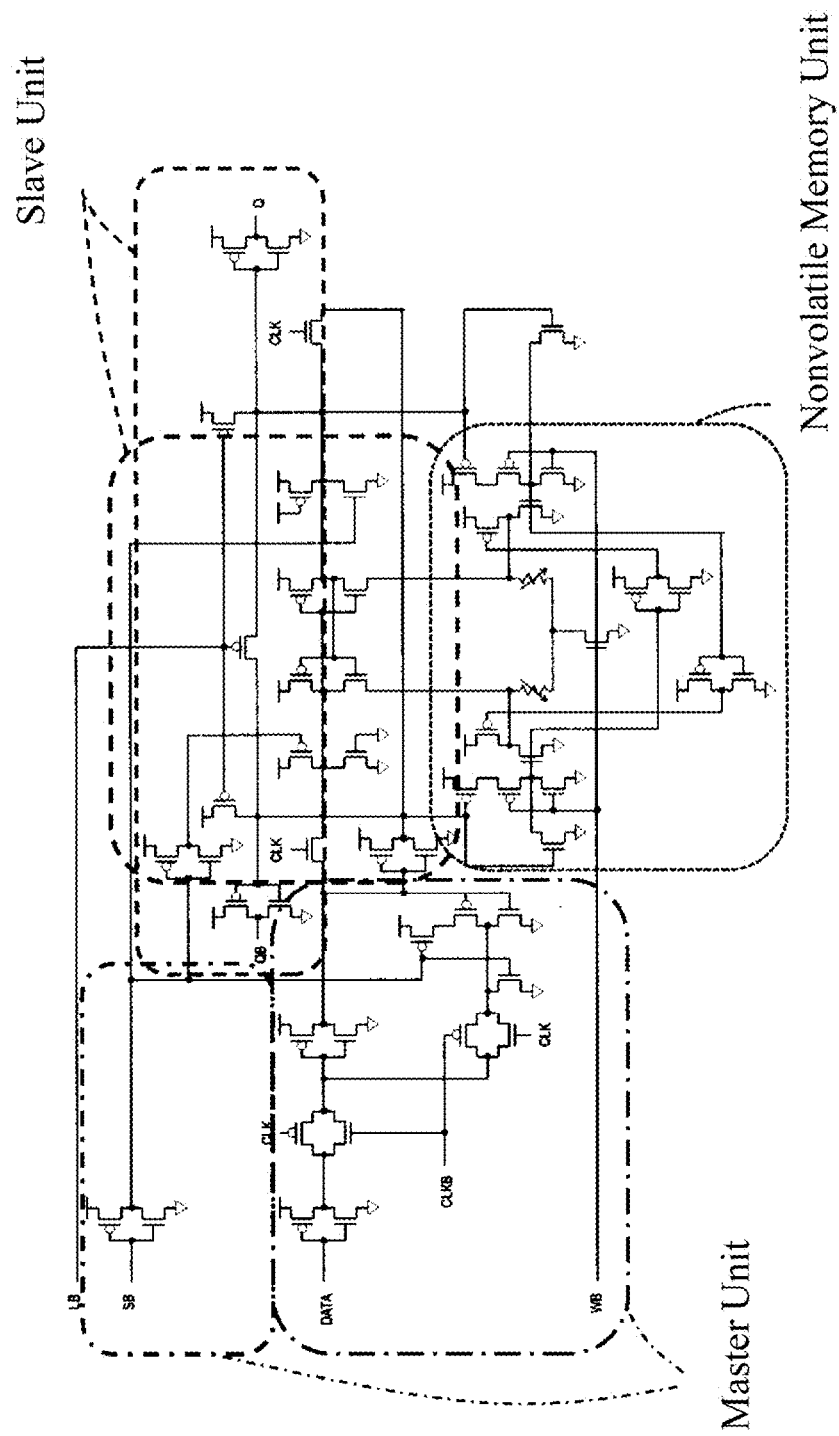
FIG. 15 is an example to illustrate a nonvolatile flip-flop circuit.
Figure 16:
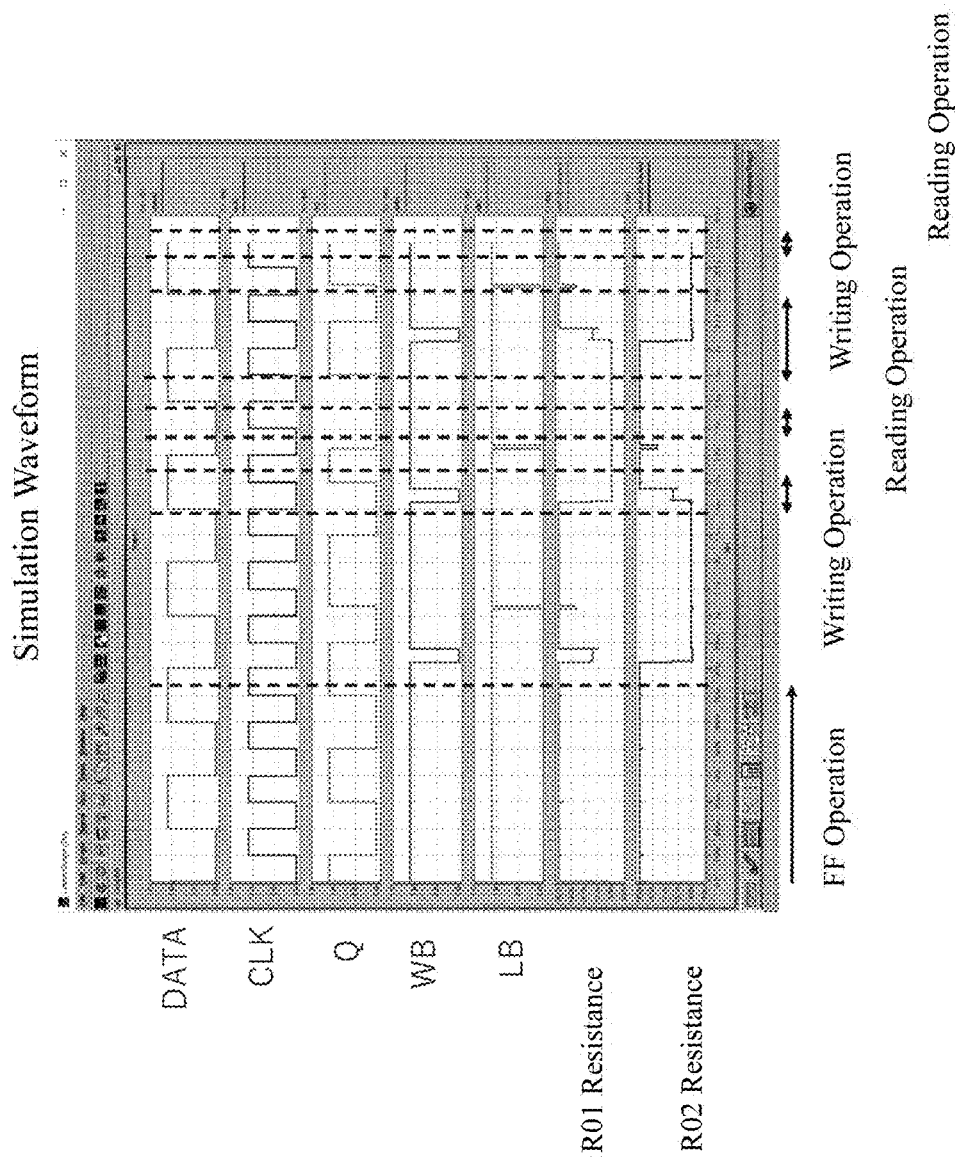
FIG. 16 is a diagram to illustrate a simulation waveform.
Figure 17:
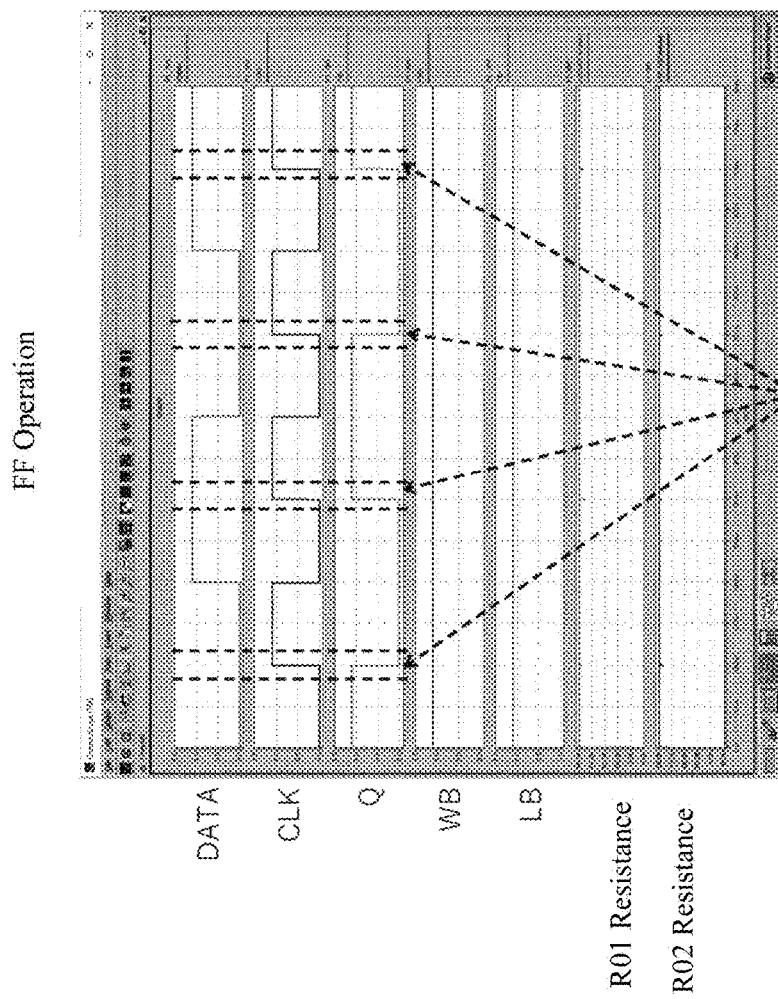
FIG. 17 is a diagram to illustrate a flip-flop operation.
Figure 18:
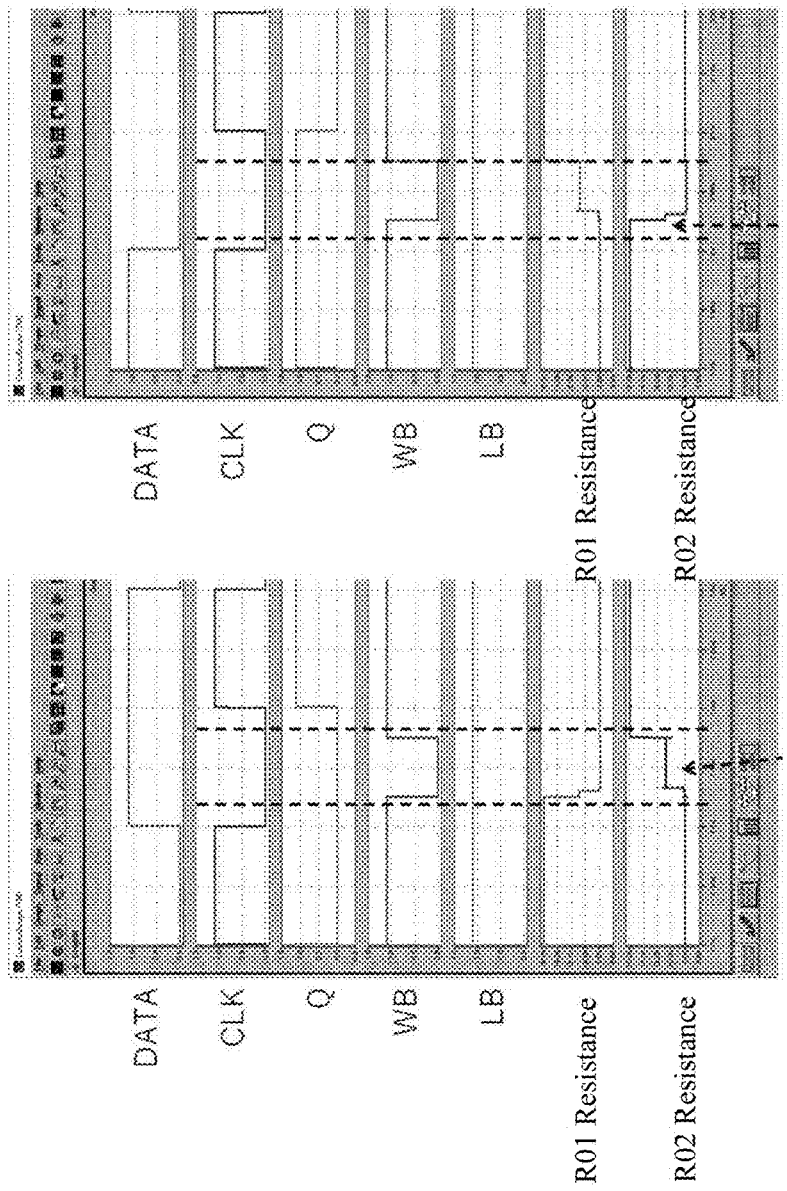
FIG. 18 is a diagram to illustrate a writing operation.
Figure 19:
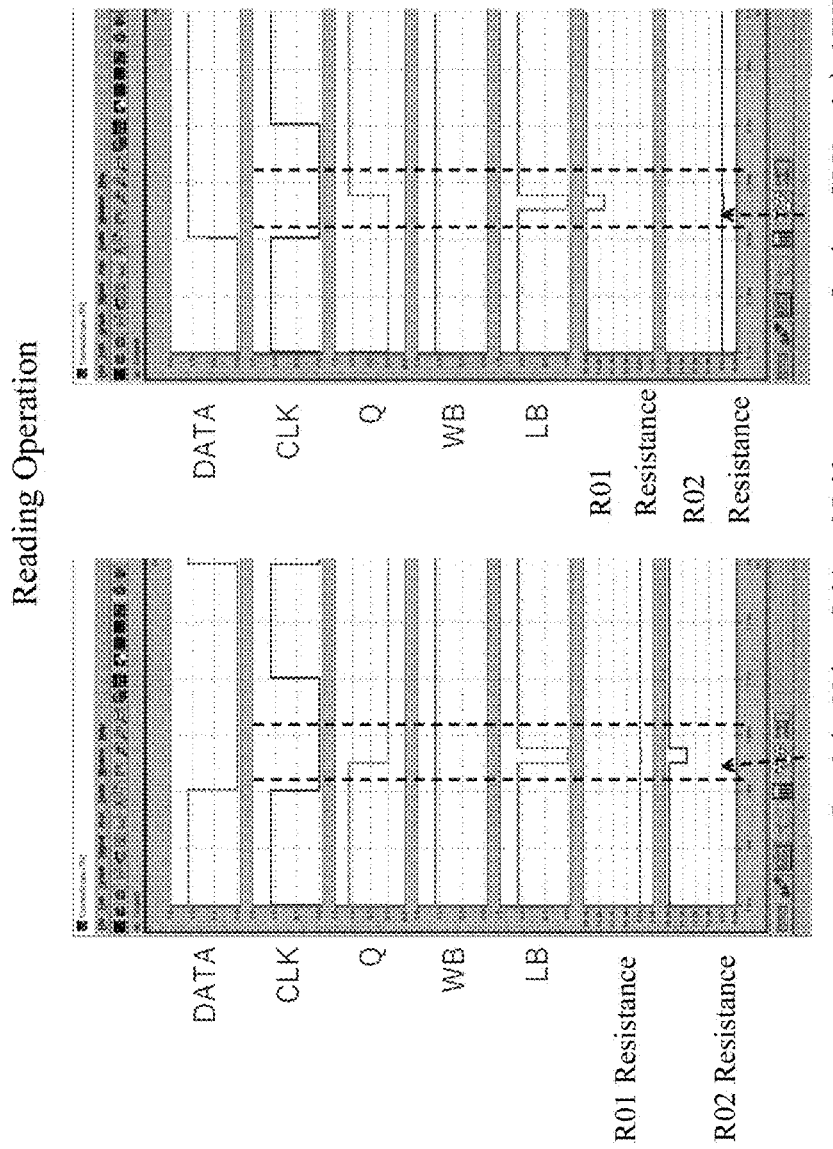
FIG. 19 is a diagram to illustrate a reading operation.

FIG. 15 is an example to illustrate a nonvolatile flip-flop circuit. FIG. 16 is a diagram to illustrate a simulation waveform. FIG. 17 is a diagram to illustrate a flip-flop operation. FIG. 18 is a diagram to illustrate a writing operation. FIG. 19 is a diagram to illustrate a reading operation. The flip-flops are a master-slave type flip-flops, which can be divided into a master unit, a slave unit, and a nonvolatile memory unit. In the embodiment of the present invention, an MTJ element is used for constituting a nonvolatile memory unit.

In FIG. 16, "DATA" represents an input signal; "Q" and "QB" represent output signals (complement to each other, "B" stands for Bar, or complement); "CLK" and "CLKB" represent clock signals (complement to each other); "LB" represents a reading control signal, usually it is "1" but when it is "0", a reading processing from the MTJ element to a memory unit of FF is performed; "WB" represents a writing control signal, usually it is "1" but when it is "0", a writing processing from the memory unit of FF to the MTJ element is performed; "SB" represents a setting signal, usually it is "1" but when it is "0", FF memory state is turned to "1" regardless of an input.

The FF circuit can be mainly divided into three units: a master unit, a slave unit, a nonvolatile memory unit. The master unit captures an input signal DATA when a clock is "0" and the master unit passes the signal to the slave unit when the clock is "1". The slave unit captures the DATA from the master unit and further outputs it to "Q" and "QB" when the clock is "1". The slave unit performs nothing when the clock is "0". The combination of the master unit and the slave unit works as a usual master-slave type D flip-flop.

The nonvolatile memory unit includes: two MTJ elements that complementally store 1-bit memory; and a writing circuit that generates current to write data into the MTJ elements. The nonvolatile memory unit writes data captured in the slave unit into the nonvolatile memory or reads the data from the nonvolatile memory to the slave unit depending on the control signal LB or WB.

Figure 20:
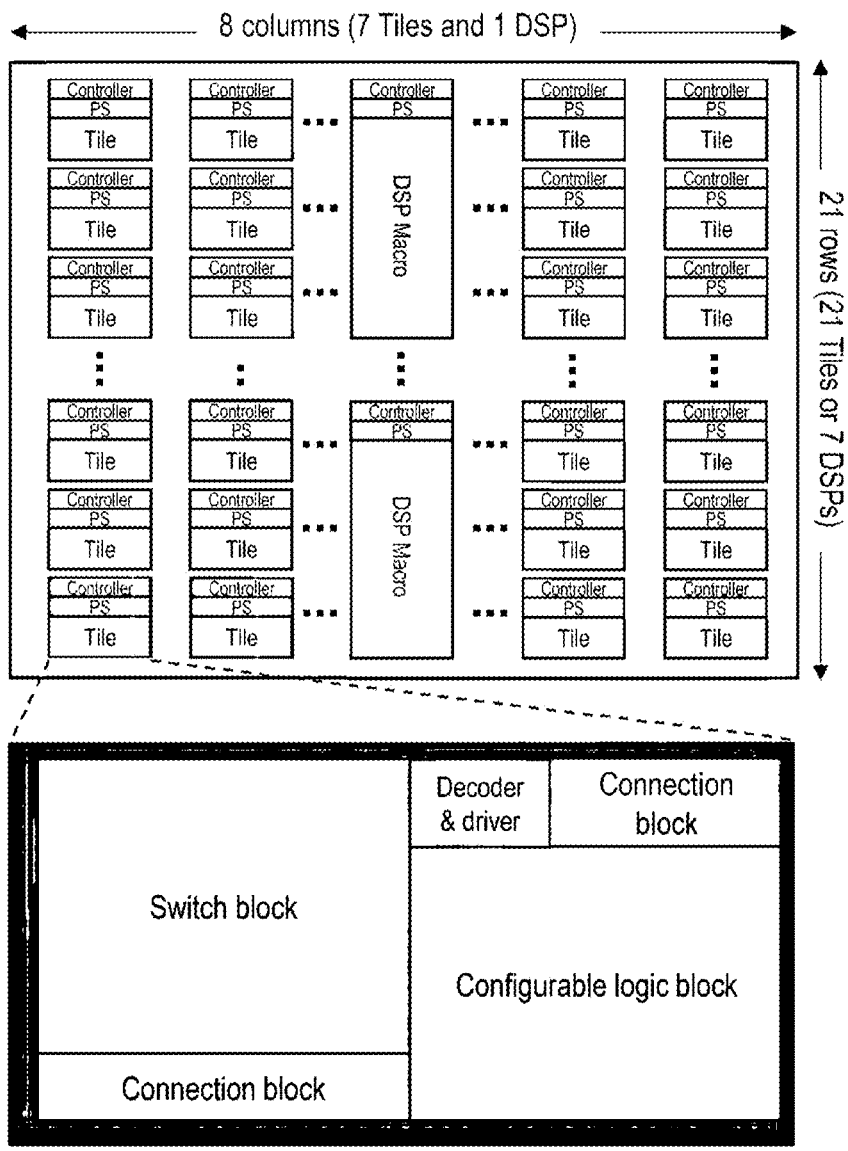
FIG. 20 is a diagram to illustrate details of an NV-FPGA.

Next, an NV-FPGA will be explained in detail. FIG. 20 is a diagram to illustrate details of an NV-FPGA. In FIG. 20, the NV-FPGA is configured to 8 columns-21 rows; however, it can be freely set. Each tile in the FPGA has a power switch (PS) and a controller to turn ON/OFF the power, enabling each tile to be power-gated.

Figure 21:
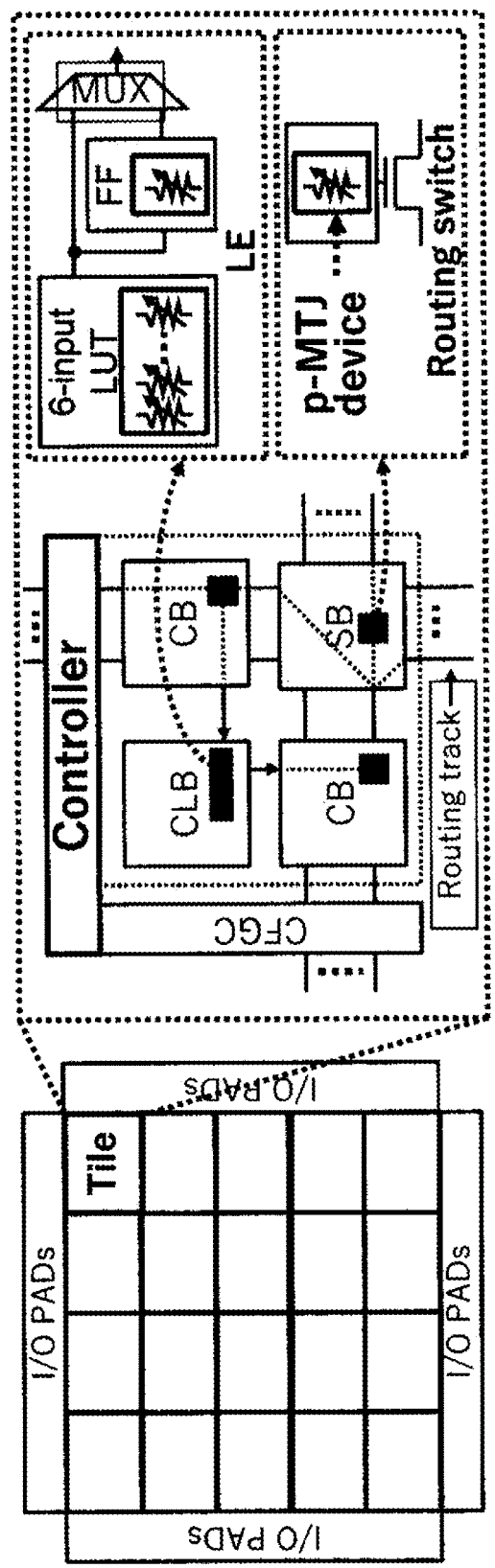
FIG. 21 is a diagram to illustrate a tile configuration in the NV-FPGA.

FIG. 21 is a diagram to illustrate a tile configuration. The tile includes: a configurable logic block (CLB) having some logic elements (LEs); a connecting block (CB) to interface the CLB to some routing tracks; a switch block (SB) for signal routing; a configuration circuit (CFGC); and a controller. A logic element LE, for example, includes: a 6-input LUT circuit, a flip-flop (FF) circuit, and a multiplexer (MUX). Configuration data of the CLB, SB, and CB are written via the CFGC. Values in a truth table are written into an MTJ element in each LUT circuit to perform a predetermined logical computing. The FF circuit is constituted of a CMOS-FF unit and an MTJ element unit. When it operates as usual, data is read/written by using the CMOS-FF; immediately before turning off the power, a value of the CMOS-FF is written into the MTJ element unit; when the power turns on again, the value stored in the MTJ element unit is written back into the CMOS-FF. The CB connects any input/output pin of the CLB with any routing track on the basis of the configuration data. The SB connects each routing track with any neighbor tile on the basis of the configuration data.

A routing switch, which is a basic component of the above-described CB and SB, is a circuit to control turning ON/OFF of a path transistor on the basis of memory data. The memory data are stored in an MTJ-based latch with an area efficiency. The path transistor is implemented using an NMOS switch. The controller is used to perform power-gating at block level. Each function block is optimally turned off.

Figure 22:
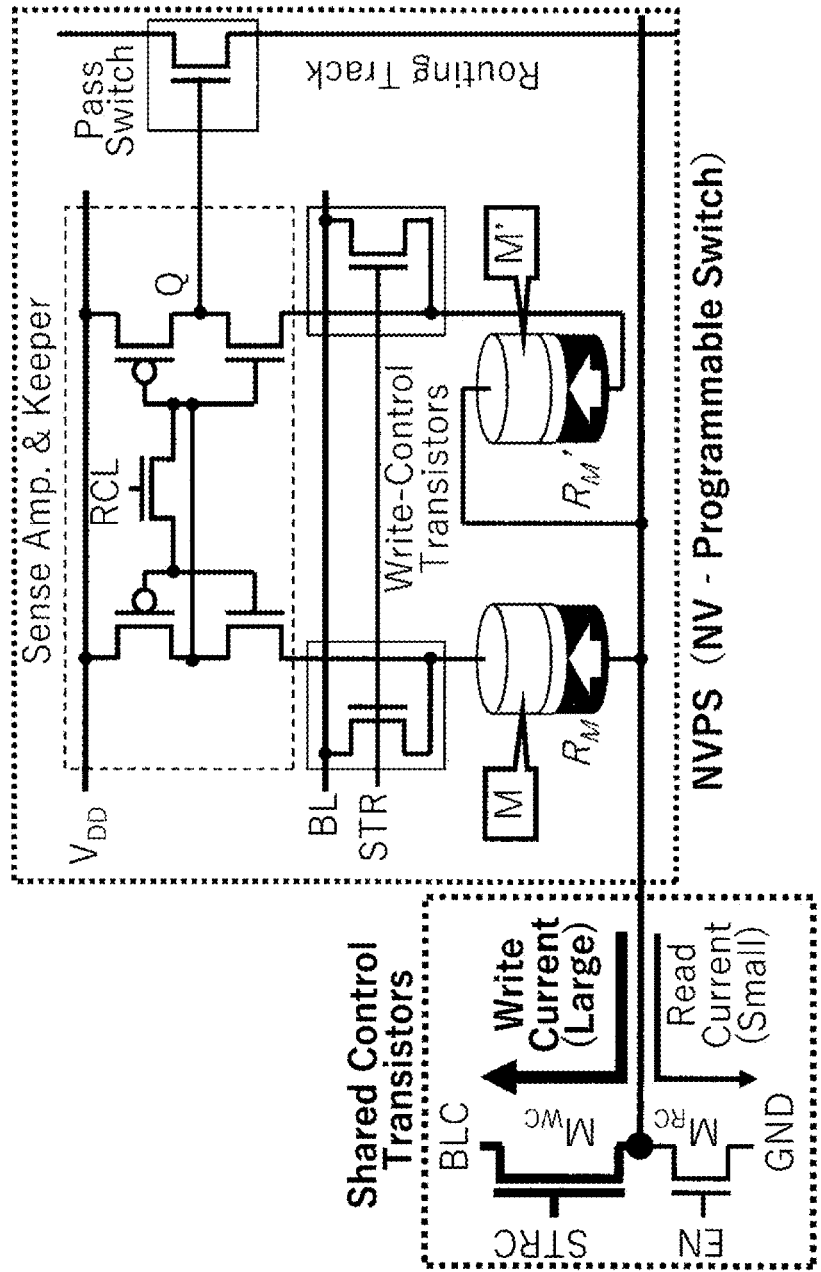
FIG. 22 is an example to illustrate a circuit including a circuit with a routing switch.

The switch block (SB) and the connection block (CB) are both configured to include a basic component referred to as a routing switch, which includes a nonvolatile storage area. FIG. 22 is an example to illustrate a circuit including a circuit with a routing switch. An output (Q) from a nonvolatile memory element is used to turn ON/OFF an NMOS path switch. The nonvolatile memory element includes: two inverters, two local write-control transistors, a sense amplifier using two MTJ devices. The routing information is complementarily programmed. The sense amplifier reads a stored state M during the power on period without generating a steady DC current path, and is used to keep it as Q. Once the configuration data are programmed, no additional control transistor is required because the configuration data are unchanged.

Note that the tile includes a decoder and a driver, which embodies a reconfigurable computing module after the fabrication.

Figure 23:
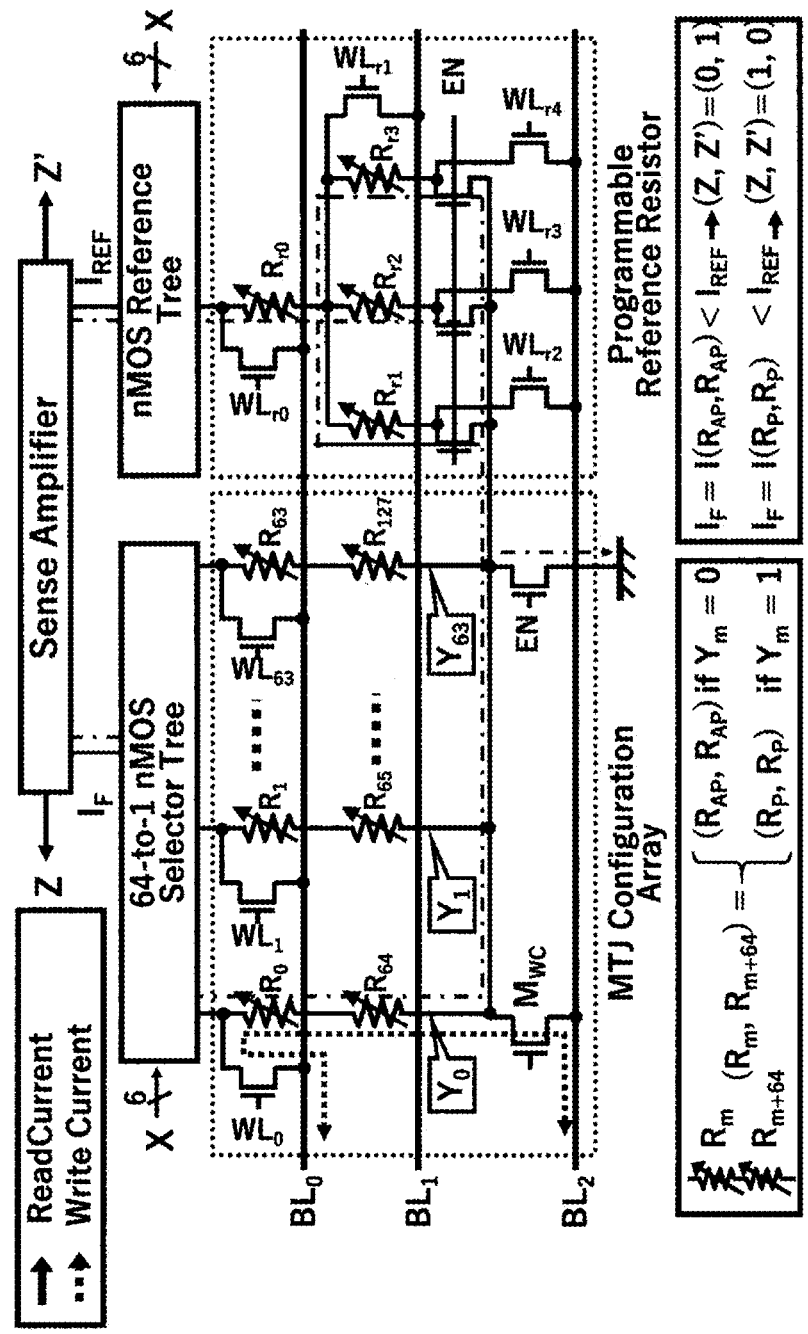
FIG. 23 is a block diagram to illustrate a 6-input LUT circuit.

The configurable logic block (CLB) is configured to include a basic component referred to as a logic element, which is constituted of a nonvolatile Lookup Table circuit (nonvolatile LUT circuit) and a nonvolatile flip-flop (nonvolatile FF), both having a nonvolatile memory function. FIG. 23 is a block diagram to illustrate an example of a Lookup Table circuit.

FIG. 23 is a block diagram to illustrate a 6-input LUT circuit. The 6-input LUT circuit is constituted of five components: a sense amplifier, a 64-to-1 NMOS selector, an MTJ configuration array, an NMOS reference tree, and a programmable reference resistor.

A truth table for an arbitrary 6-input logical function is stored in series connected MTJ devices with 64 pairs in the MTJ configuration array, such as ($R_0$, $R_{64}$), ($R_1$, $R_{65}$), ($R_{63}$, $R_{127}$). The writing operation to store a logical function information into the MTJ devices is performed by activating a word line (WL) and a bit line (BL). It is almost same as a writing operation in a conventional magnetic RAM (MRAM). $BL_0$ and $BL_2$ are shared between the MTJ configuration array and a programmable calibration resistor. A writing access transistor Mwc is shared between the 64 MTJ pairs in the MTJ configuration array. The logical operation of the LUT circuit is completely different from the reading operation of the MRAM because neither the BL nor the WL are used in the operation.

When an EN is set to high and both an NMOS selector and an NMOS reference tree are activated by complementary logic inputs X, a current $I_F$ and $I_{REF}$ respectively pass through a pair of MTJ corresponding in the MTJ configuration array and the programmable calibration resistor. When a difference between $I_F$ and $I_{REF}$ is sensed, a complemental full swing outputs (Z, Z') are generated by the sense amplifier.

In order to ensure a sufficient sensing margin, series/parallel connected MTJ devices in the MTJ configuration array and the programmable calibration resistor are configured as follows. First, in the MTJ configuration array, when the stored data Y are 0, it is configured to ($R_{AP}$, $R_{AP}$); and when the stored data Y are 1, it is configured to ($R_P$, $R_P$). When a resistance value of the MTJ device follows Gaussian distribution N (R, $\sigma_R^2$) (where R is an average value and $\sigma_R$ is a standard deviation), the total resistance value of series connected MTJ devices follows N (2R, $2\sigma_R^2$). That means the resistance distribution can be narrowed to avoid an overlap of ($R_P$, $R_P$) state and ($R_{AP}$, $R_{AP}$) state.

Next, in the programmable calibration resistor, the total resistance is adjusted to insert $I_{REF}$ in the middle of I ($R_P$, $R_P$) and I ($R_{AP}$, $R_{AP}$). As a MTJ device has two different resistance values, by using four MTJ devices ($R_{r0}$, $R_{r1}$, $R_{r2}$, $R_{r3}$), 16 different reference resistance values can be obtained. The total resistance value can be adjusted following the fluctuation of the $I_F$ current level due to process variation. Note that $R_P$ represents a low resistance and $R_{AP}$ represents a high resistance in the MTJ device.

Figure 24:
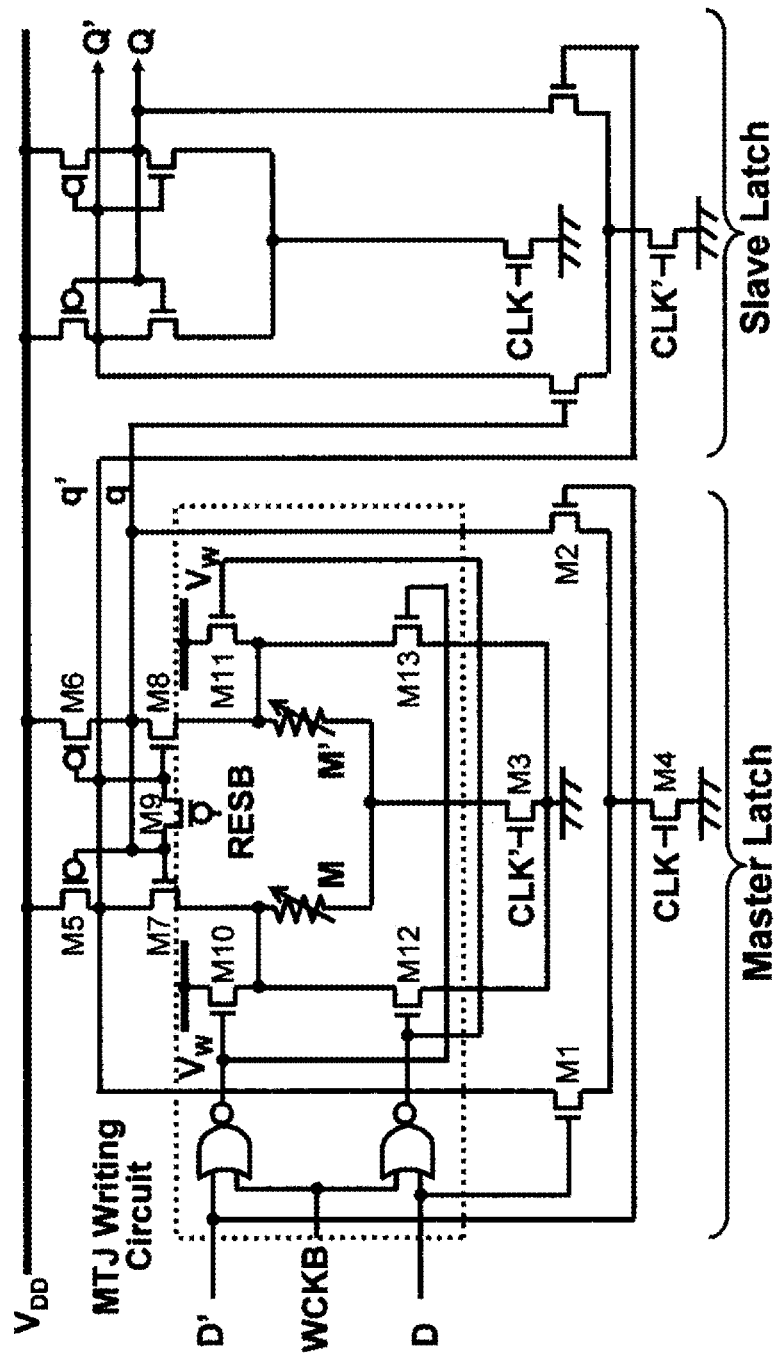
FIG. 24 is an example to illustrate a nonvolatile flip-flop circuit.

FIG. 24 is an example to illustrate a nonvolatile flip-flop circuit. A nonvolatile flip-flop circuit (nonvolatile FF circuit) include: an NMOS-based differential-pair circuit (DPC), a cross coupled CMOS inverters, two MTJ devices, and an MTJ writing circuit. In a normal operation, complementary inputs (D, D') from the NV-LUT circuit are stored in the cross coupled CMOS inverters. When WCKB is activated at low level, they are stored in the MTJ devices (M, M') in a master latch. Behaviors of the master latch are as follows.

Figure 25A:
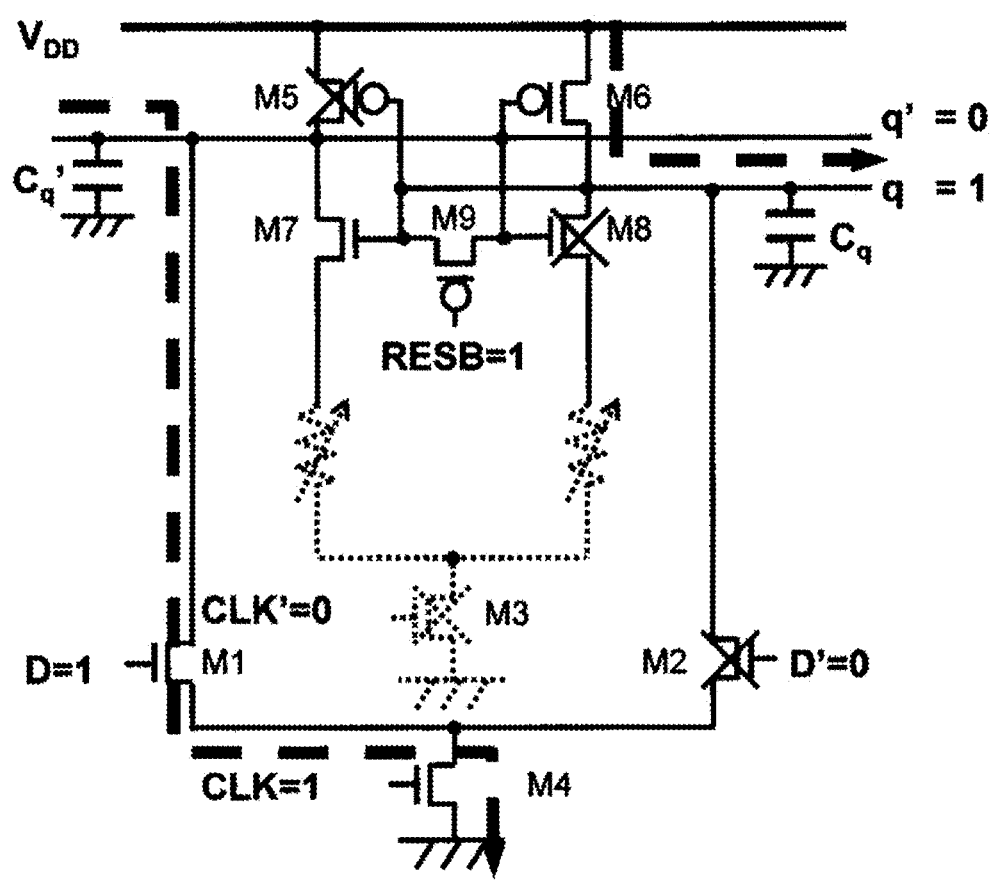
FIG. 25A is a diagram to illustrate a THROUGH phase (CLK=1 and CLK'=0) of an operation in the circuit of FIG. 24.

FIG. 25A is a diagram to illustrate a THROUGH phase (CLK=1 and CLK'=0). As M1 and M4 are turned on, a load capacitance Cq' is discharged to GND and M6 is turned on. As a result, a load capacitance Cq is charged, voltage at an output node q becomes VDD, and the output node q' becomes 0 V.

Figure 25B:
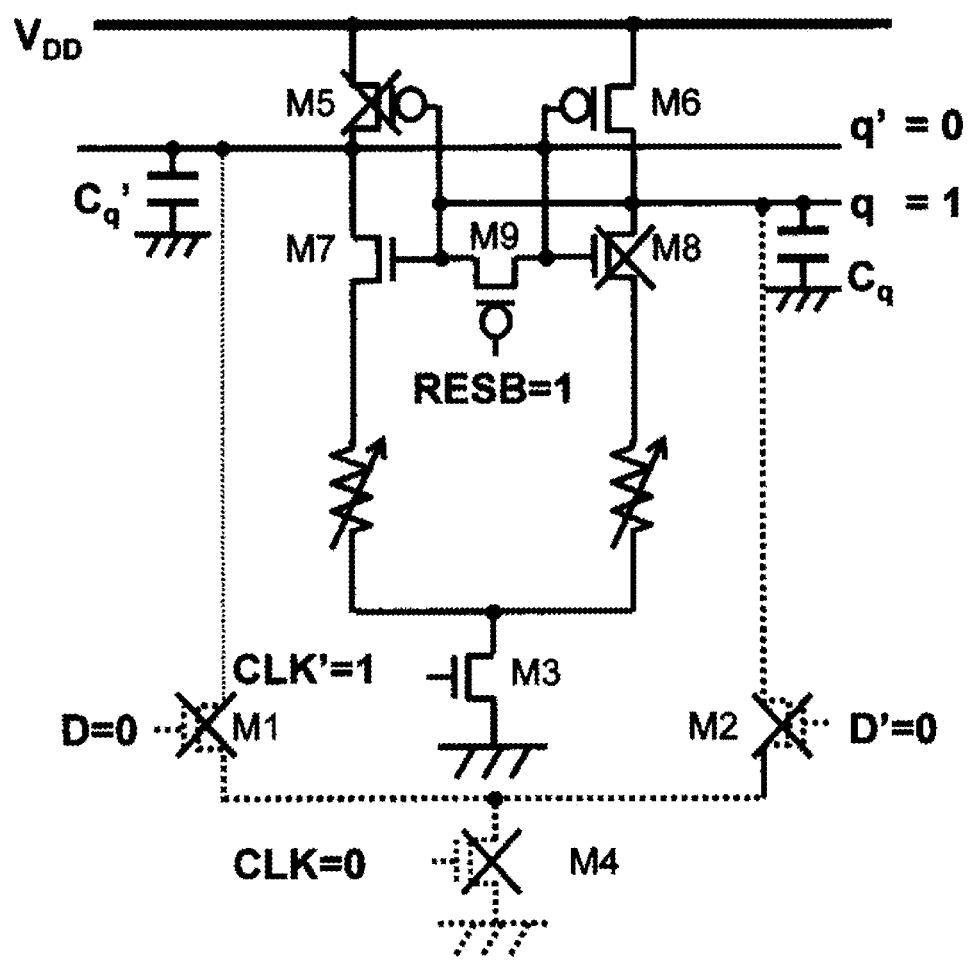
FIG. 25B is a diagram to illustrate a HOLD phase (CLK=0 and CLK'=1) of an operation in the circuit of FIG. 24.

FIG. 25B is a diagram to illustrate a HOLD phase (CLK=0 and CLK'=1). As M3 is turned on, voltages at the output node (q, q') are held in a cross-coupled CMOS inverters. At the same time, M1 and M2 are turned off so that the DPC does not operate. As a result, there is no direct current path from VDD to GND.

Figure 25C:
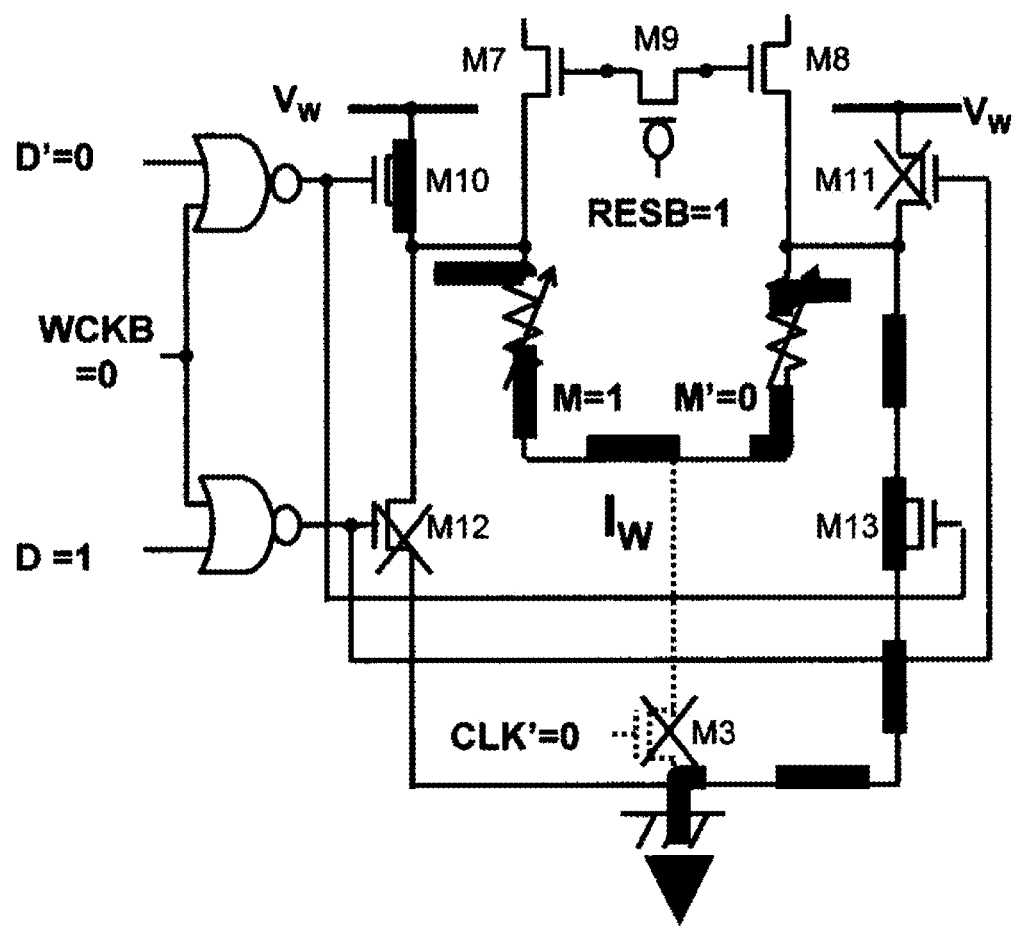
FIG. 25C is a diagram to illustrate a STORE phase of an operation in the circuit of FIG. 24.

FIG. 25C is a diagram to illustrate a STORE phase. When inputs (D, D') are (1, 0) and WCKB is activated at low level, M10 and M13 are turned on by NOR gates and a writing current Iw is applied to MTJ devices.

Figure 25D:
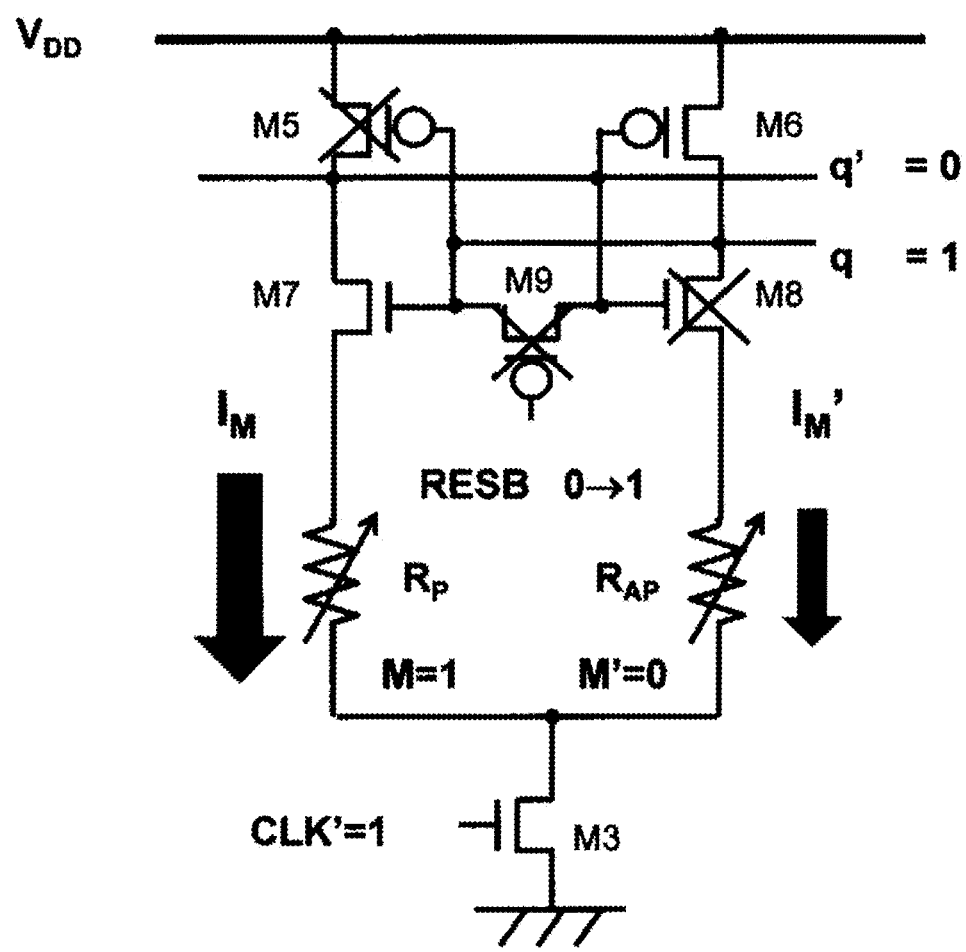
FIG. 25D is a diagram to illustrate a RESTORE phase of an operation in the circuit of FIG. 24.

FIG. 25D is a diagram to illustrate a RESTORE phase. When RESB is activated at low level, M9 is turned on and voltages at the output node q and q' are balanced. As a result, the clamped voltage is applied to each MTJ device. Then, sensing currents $I_M$ and $I_{M'}$ are respectively penetrated through M and M'. When RESB is activated at high level, M9 is turned off and a difference between $I_M$ and $I_{M'}$ is amplified by the cross-coupled CMOS inverters.

In the nonvolatile FF circuit shown in FIG. 24, data stored in the FF constituted of CMOS inverters, which are cross-coupled immediately before turning off the power, are written into MTJ elements, and the data are read again as the stored data from the MTJ elements by the CMOS inverters of FF, which are cross-coupled after turning on the power. Thus, no data back up/reloading via an external nonvolatile memory is required, enabling a prompt turning ON/OFF the power transition.

Preferably, a DSP (Digital Signal Processor) is incorporated. Using a DSP enables even a relatively large volume computing. The DSP is also provided with a power switch (PS) and a controller to turn ON/OFF the power, enabling each tile to be power-gated. Similarly in the tile, a switch block and a connection block in the DSP are configured to include a basic component, referred to as a routing switch, which includes a nonvolatile storage area.

As described above, each basic component in the NV-FPGA includes a nonvolatile memory, which stores the configuration data. In addition, the nonvolatile memory also stores a memory state of the flip-flop. Therefore, it is unnecessary to back up data in an external nonvolatile memory immediately before turning off the power or write back the data after turning on the power again, enabling easy turning ON/OFF the power. By writing a certain computing into a nonvolatile FPGA in advance and turning on the power as needed basis, computing can be immediately started and the CPU processing can be accelerated. In addition, turning off the power during the non-use period can avoid wasteful power consumption.

Figure 26:
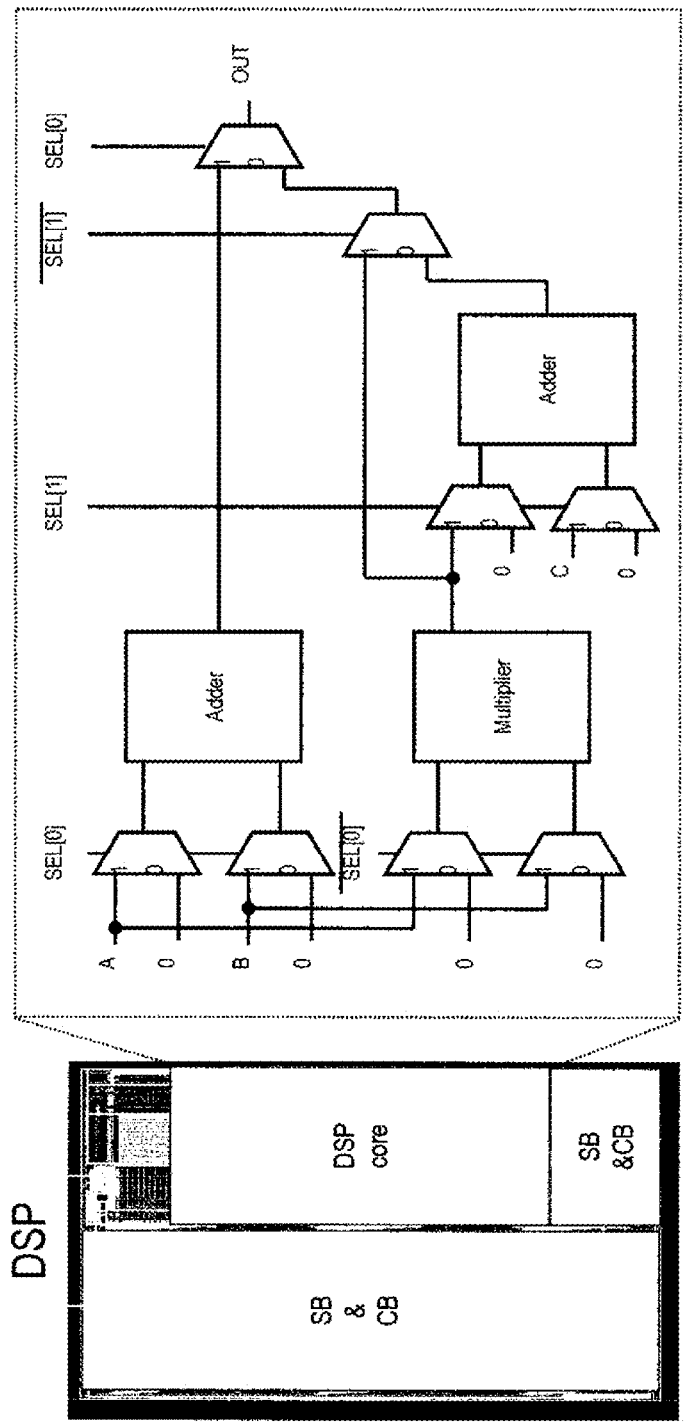
FIG. 26 is a diagram to illustrate a circuit configuration of a DSP core.

In the circuit configuration of a DSP core in FIG. 26, SEL [0] and SEL [1] represent control signals to select a function; A, B, and C represent an input; and OUT represents an output. It operates as a circuit to perform the following computing:
when (SEL [0], SEL [1])=(0, 0), OUT=A×B;
when (SEL [0], SEL [1])=(0, 1), OUT=A×B+C;
when (SEL [0], SEL [1])=(1, 0), OUT=A+B; and
(SEL [0], SEL [1])=(1, 1) is not used.

Here, any circuit configuration can be used and other configurations are possible.

Thus, NV-FPGA 4 preferably has one or more tiles to perform a part of operations on CPU 3 and a DSP (Digital Signal Processor) to perform a part of operations on CPU 3 faster than the tile because they can satisfy both low power consumption and high performance as shown in FIG. 3B.

Implementation Examples

Next, implementation examples will be explained. TABLE 2 provides specifications for chips actually fabricated.

TABLE 2

| | |
|---|---|
| MOS Tech. Node | 40-nm LVT, SVT, HVT |
| MTJ Tech. Node | 39-nm perpendicular (Electrically determined size) |
| Supply Voltage | 1.1-1.3 V (Core) |
| | 1.8/3.3 V (Peripherals) |
| MRAM Capacity | 64 kB |

TABLE 2-continued

| | |
|---|---|
| | (4 kB sub-array × 16) |
| MRAM Sub-Array Structure | 2T-2MTJ cell |
| | 256 cols. × 64 rows × 2 |
| FPGA Capacity | 1,176 six-input LUTs |
| | 7 DSPs |
| Transistor Count | 4.8M |
| MTJ Count | 1.5M |

Figure 27:
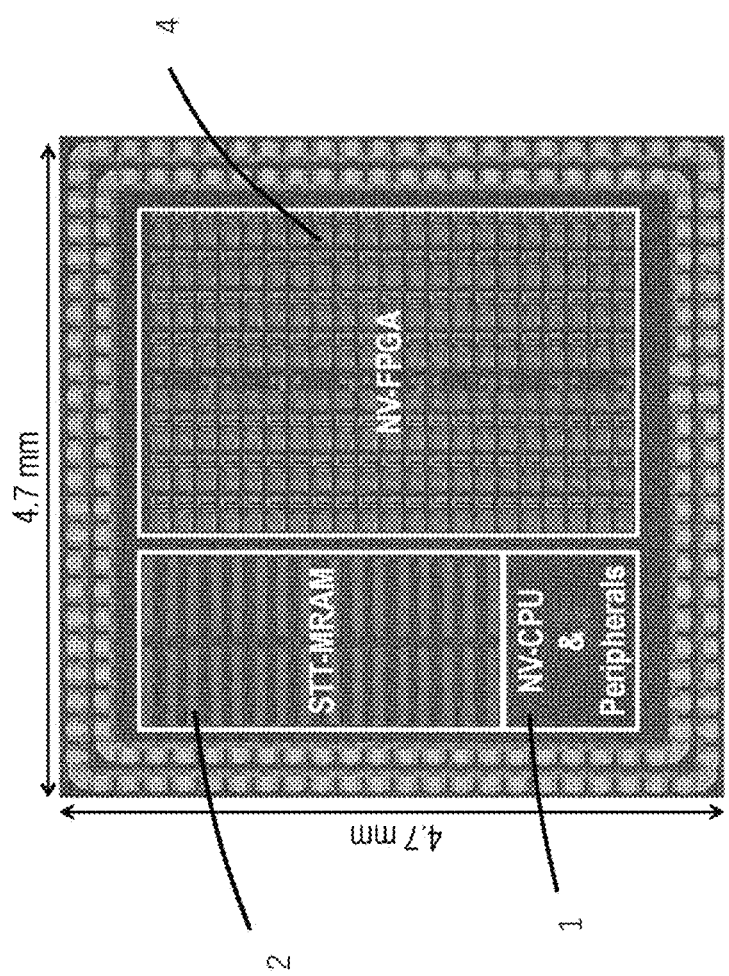
FIG. 27 is an image of a chip fabricated as an embodiment.

FIG. 27 is an image of a fabricated chip, including an STT-MRAM, an NV-CPU and its peripheral circuits, and an NV-FPGA.

Figure 28:
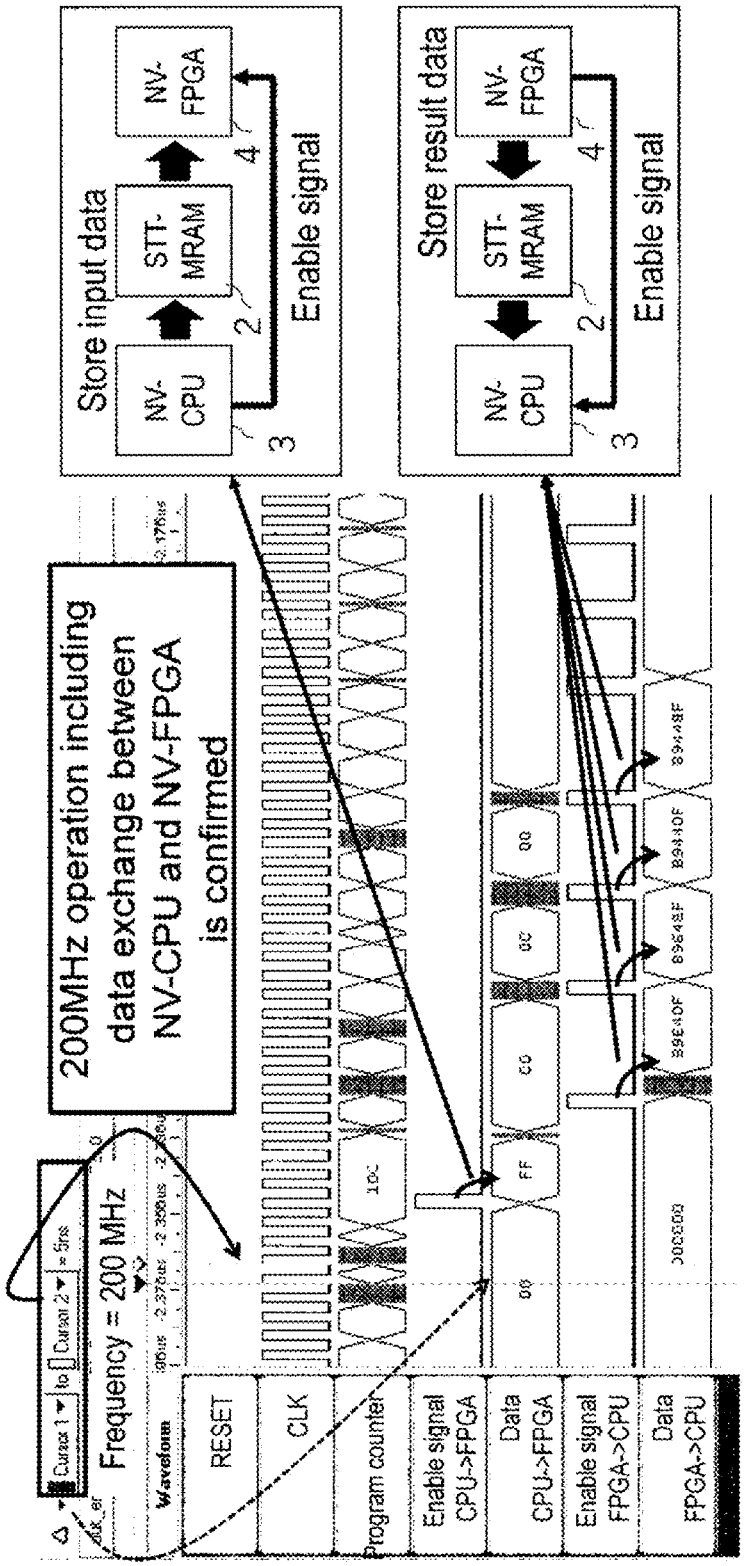
FIG. 28 is a diagram to illustrate a measurement waveform.

FIG. 28 is a diagram to illustrate a measurement waveform. A program counter operates in response to a 200 MHz clock (CLK), data are transmitted from NV-CPU 3 to NV-FPGA 4 via MRAM 2 in response to an enable signal from NV-CPU 3 to NV-FPGA 4, and data are transmitted from NV-FPGA 4 to NV-CPU 3 via MRAM 2 in response to an enable signal from NV-FPGA 4 to NV-CPU 3. The enable signals are control signals between NV-CPU 3 and NV-FPGA 4, and data flow from NV-CPU 3 to NV-FPGA 4 via MRAM 2 or flows from NV-FPGA 4 to NV-CPU 3 via MRAM 2. In the present example, data exchange at 200 MHz can be achieved between NV-CPU 3 and NV-FPGA 4. Here, a specific address region in MRAM 2 is reserved as a region to store data transmitted between NV-CPU 3 and NV-FPGA 4. Data to be input from NV-CPU 3 to NV-FPGA 4 are written into the region, a signal indicating completion of writing and completion of preparation for starting a calculation is passed from NV-CPU 3 to NV-FPGA 4, and NV-FPGA 4 starts computing using the data written into the above region. After computing, the results calculated by NV-FPGA 4 are passed to NV-CPU 3 in the similar way. As the address to store data transmitted between NV-CPU 3 and NV-FPGA 4 is pre-determined, only a signal indicating completion of writing and completion of preparation for starting a calculation is transmitted between them and it is unnecessary to pass the data about the memory address storing data related to the process.

Figure 29:
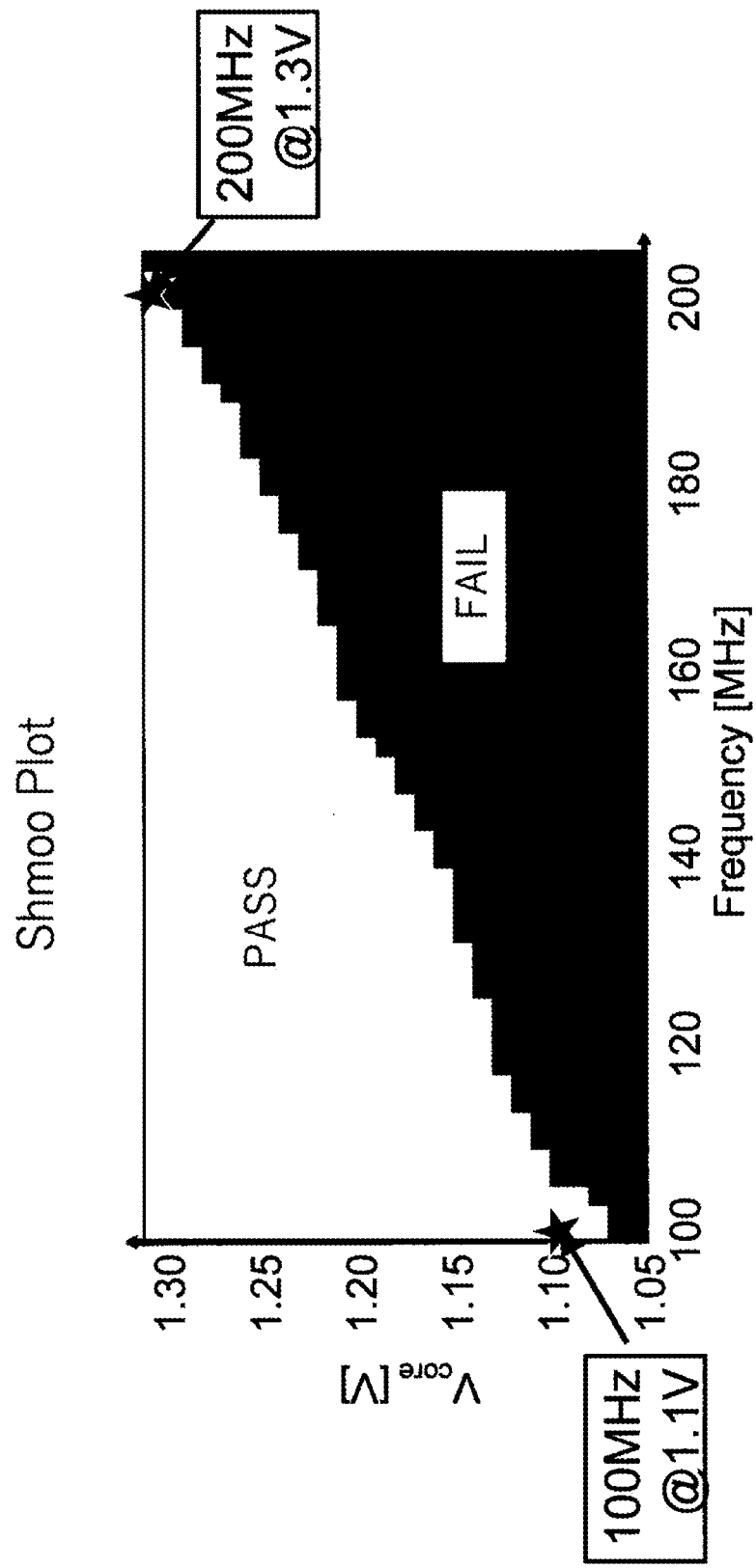
FIG. 29 is a shmoo plot.

FIG. 29 is a shmoo plot. The vertical axis represents core voltage (V) of the NV-CPU, the NV-FPGA, the STT-MRAM and the horizontal axis represents operating frequency (MHz). According to the shmoo plot, the following operational combinations of frequency and voltage have been checked in the range of no less than 100 MHz and no more than 204 MHz, core voltage range from 1.05 V to 1.30 V, at 2 MHz interval, and 0.1 V interval. Operations in the white area in FIG. 29 have been validated. Operations at 100 MHz can be validated in the range of no less than 1.07 V and no more than 1.3 V at 0.1 V interval. Operations at 202 MHz can be validated at 1.3 V. Since 100 MHz frequency operations at 1.1 V voltage and 200 MHz frequency operations at 1.3 V voltage have been validated, operations with voltage above an approximate line or curve through these two points applied to each core can be ensured. The approximate line can be, for example, $2 \times 10^{-3} f - V + 0.9 = 0$ (f: frequency (MHz), V: voltage (V)).

Figure 30:
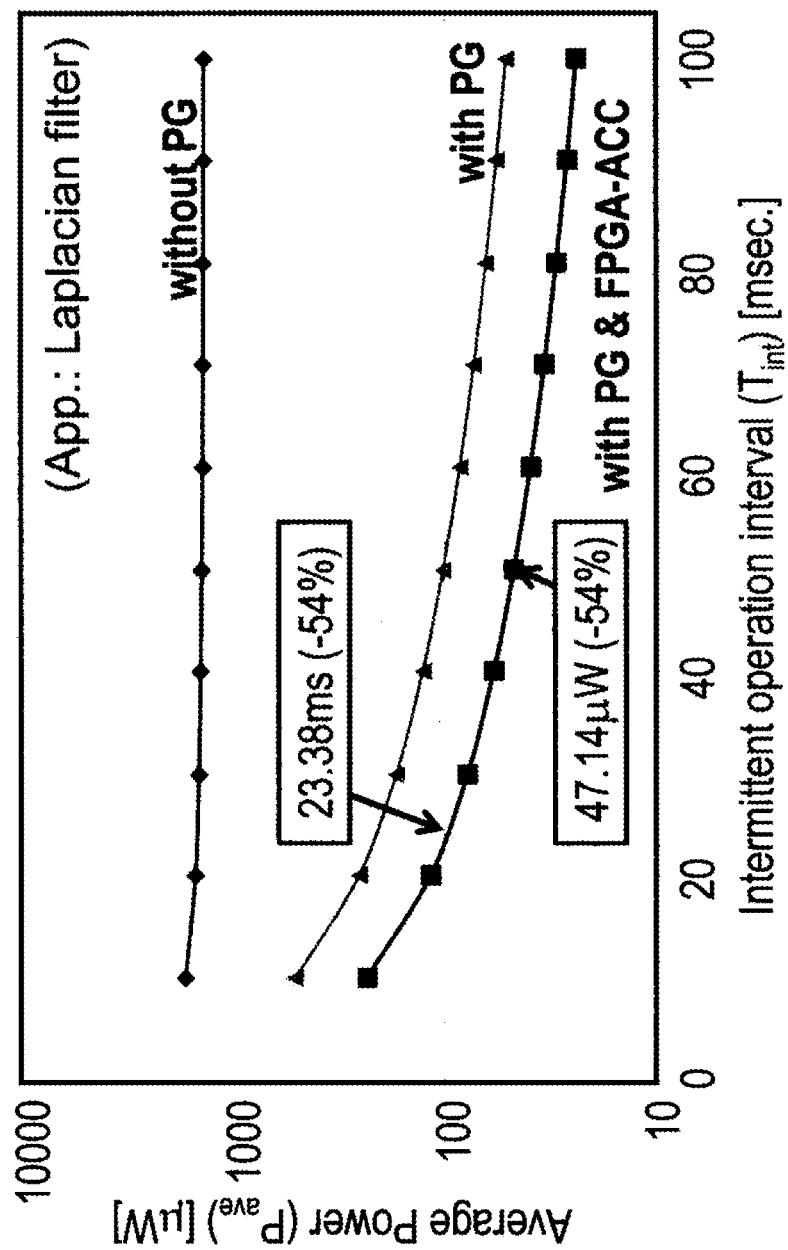
FIG. 30 is a graph to illustrate a relation between intermittent operation intervals and average power.

FIG. 30 is a graph to illustrate a relation between intermittent operation intervals and average power. It shows the results without power-gating (without PG), with power-gating (with PG), and with power-gating and also acceleration processing by FPGA (with PG & FPGA-ACC). The horizontal axis represents the intermittent operation interval, and the average powers of each intermittent operation interval of 10 ms, 20 ms, 30 ms, 40 ms, 50 ms, 60 ms, 70 ms, 80 ms, 90 ms, and 100 ms have been obtained. The data have been assumed to be processed by a Laplacian filter. Here, active state and inactive state in the NV-CPU and the NV-FPGA are repeated, and the time interval between the points of starting an operation and the next operation is referred to as "intermittent operation interval".

In the case without power-gating, average power consumption is kept high, 1000 regardless of the intermittent operation interval. On the other hand, in the case with power-gating, the longer the intermittent operation interval, the less the average power consumption. In addition, the power-gating significantly reduces the power consumption. Further, in the case with power-gating and also acceleration processing by FPGA, the longer the intermittent operation interval, the less the average power consumption, furthermore, the FPGA used in the same intermittent operation interval far greater reduces the power consumption comparing the case without the FPGA.

When the intermittent operation interval is 50 msec, the average power consumption with power-gating is 100 μW, and the case also with FPGA is 47.14 μW, which achieves reduction of power consumption by 54% comparing the case without power-gating.

The results indicating in FIG. 30 revealed that a microcontroller unit as a device according to the present example can be set with an intermittent operation interval of no more than 100 ms when it was fabricated. In addition, another view point revealed that a microcontroller unit as a device according to the present example can be used with no more than 100 μW average power. More specifically, FIG. 30 indicates that a preferable intermittent operation interval is no more than 100 ms because the intermittent operation interval of 10 ms, 20 ms, 30 ms, 40 ms, 50 ms, 60 ms, 70 ms, 80 ms, 90 ms, and 100 ms can suppress the average power to the predetermined one. Thus, any suitable range in these ranges can be used. The intermittent operation interval is preferably no less than 10 ms and no more than 100 ms, more preferably, no less than 10 ms and no more than 60 ms, still more preferably, no less than 10 ins and no more than 50 ms. In the case only power-gating is introduced in consideration that the average power is no more than 100 μW, the preferable range follows the case with power-gating and FPGA.

Figure 31:
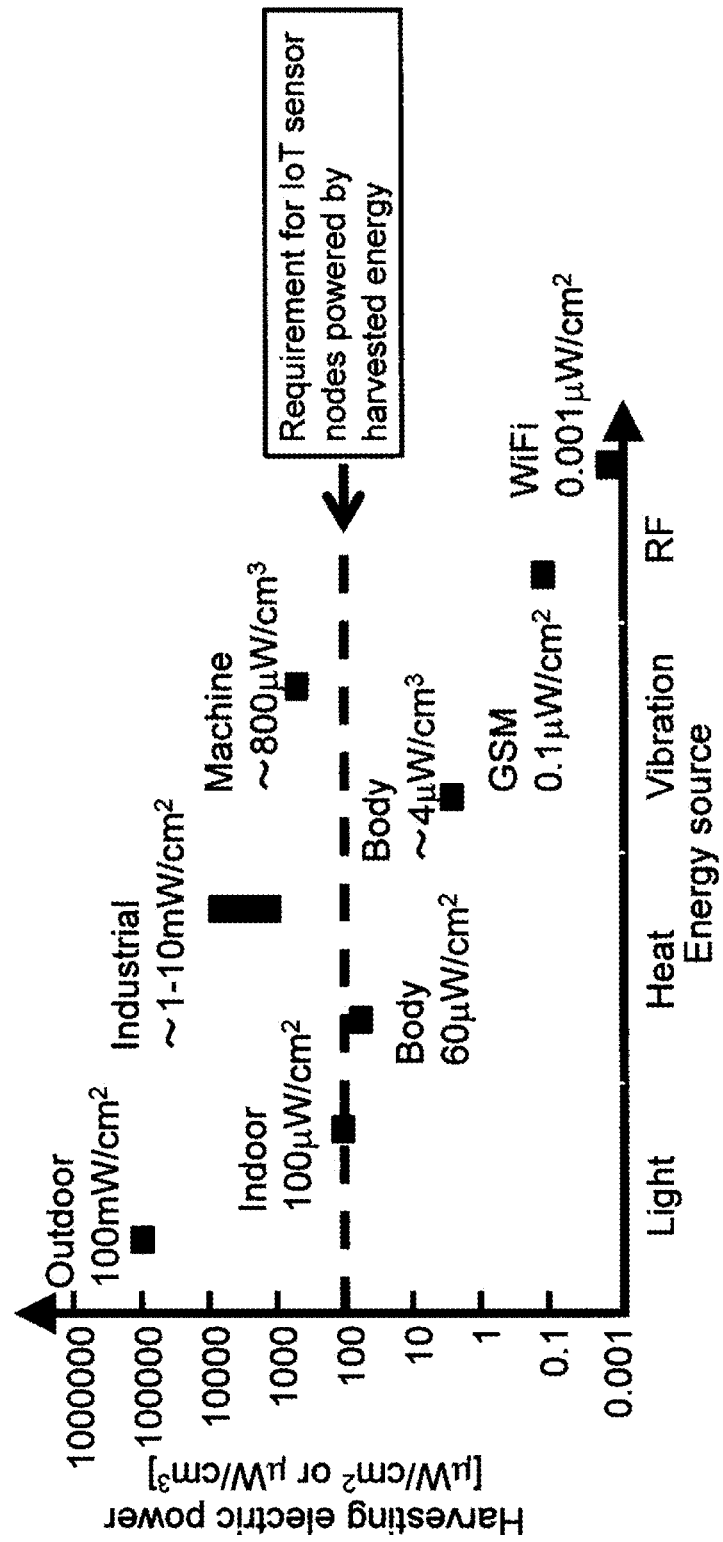
FIG. 31 is a graph to illustrate power obtained by energy harvesting per energy source.

FIG. 31 is a graph to illustrate power obtained by energy harvesting per energy source. From this graph, and assuming from the power obtained from light such as solar rays, heat, and vibration such as mechanical vibration, natural vibration, and artificial vibration, high frequency, 100 (μW/cm$^2$ or μW/cm$^3$) may be acceptable as a standard for the MCU used for an IoT sensor node driven by the power obtained by energy harvesting.

Thus, FIG. 30 reveals that the intermittent operation interval with power-gating and also processing by FPGA using the nonvolatile CPU, the MRAM, and the nonvolatile FPGA can be no less than approximately 20 msec at 100 μW average power consumption. The upper limit of the intermittent operation interval can be freely set. In addition, FIG. 30 reveals that the power-gating and also processing by FPGA achieves the average power consumption of no more than 100 μW and that a device with the intermittent operation interval of no less than 20 ins can be achieved, thereby, providing a device for IoT.

The results indicates that a device fabricated based on the present invention, in which the MRAM, the NV-CPU, and the NV-FPGA are configured with a nonvolatile memory for inactive units using an MTJ, can cut a wasteful power consumption by using power-gating technique, in which it is unnecessary to back up the data stored in a memory cell in the MRAM, the NV-CPU, and the NV-FPGA and a power controller stops power supply to each module in the MRAM, the NV-CPU and the NV-FPGA, or inactive units. In addition, a reconfigurable computing module in the FPGA implements various signal processing at high speed. Further, an access controller enables an effective data transfer between the NV-CPU and the MRAM, which allows the whole system to operate at high speed. Thus, it has been found that a microcomputer as a device with low-power and high-performance can be provided.

Figure 32:
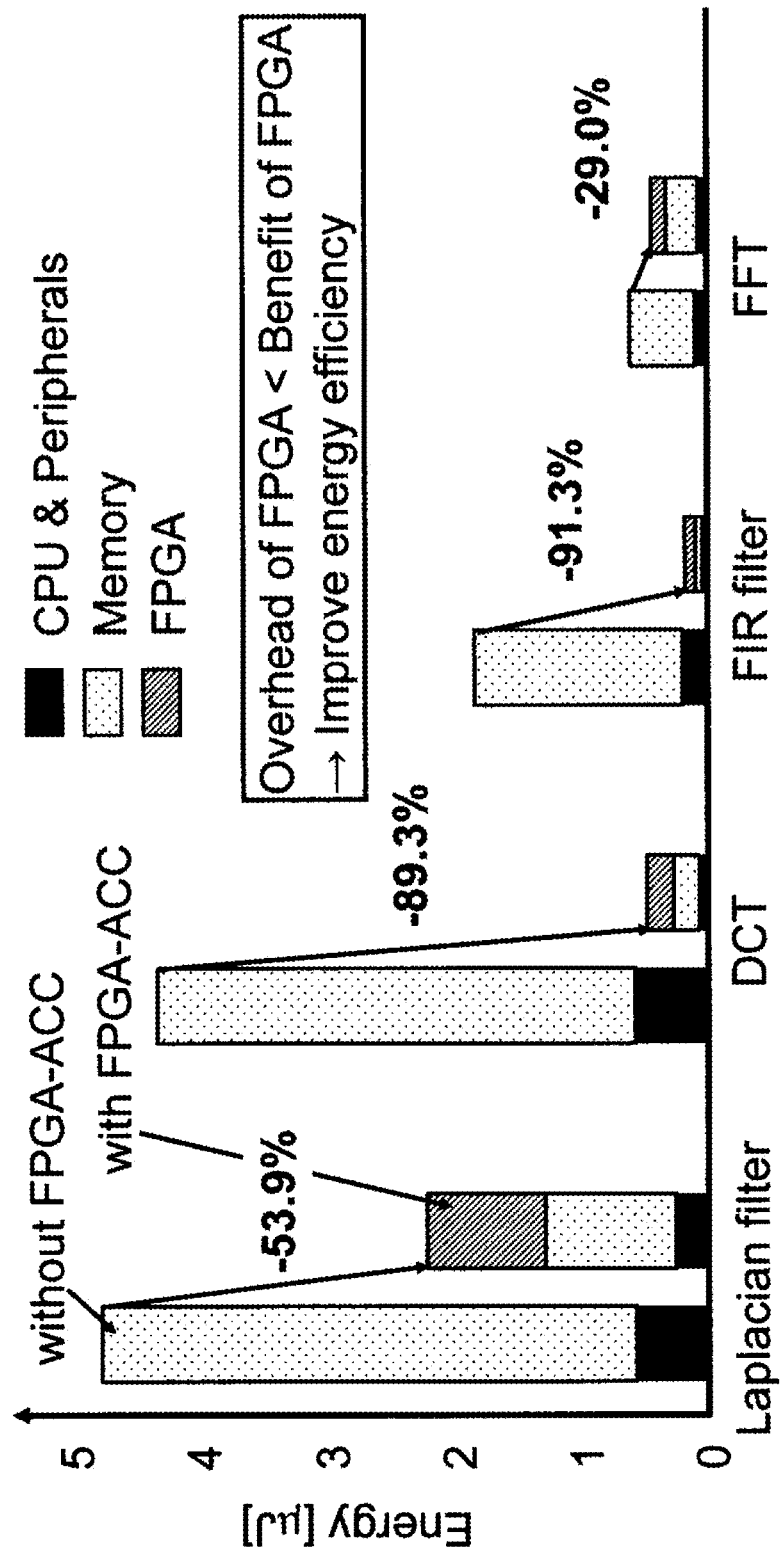
FIG. 32 is a graph to illustrate power required for each processing by a Laplacian filter, a DCT (Discrete Cosine Transform), an FIR (Finite Impulse Response) filter, an FFT (Fast Fourier Transform)

FIG. 32 is a graph to illustrate power required for each processing by a Laplacian filter, a DCT (Discrete Cosine Transform), an FIR (Finite Impulse Response) filter, an FFT (Fast Fourier Transform). In every case without processing by the FPGA, the MRAM as a memory consumes significant power; however, with processing by the FPGA, power consumption in the MRAM can significantly be reduced. The reduced power is greater than the power consumed by the FPGA, thus, achieving a great effect.

TABLE 3 represents the number of times of using tiles, DSPs, LUTs, and FFs, the maximum operating frequency, and the power at 200 MHz in the processing by a Laplacian filter, a DCT (Discrete Cosine Transform), an FIR (Finite Impulse Response) filter, and an FFT (Fast Fourier Transform).

TABLE 3

| Configured application | Device utilization | | | | Max frequency [MHz] | Power@200 MHz operation [mW] |
|---|---|---|---|---|---|---|
| | Tiles | DSPs | LUTs | FFs | | |
| Laplacian filter | 63 | 1 | 501 | 325 | 228 | 3.21 |
| DCT | 71 | 2 | 566 | 297 | 253 | 3.50 |
| FIR filter | 94 | 1 | 752 | 356 | 205 | 4.57 |
| FFT | 38 | 2 | 302 | 199 | 236 | 1.94 |

The maximum operating frequency exceeds 200 MHz regardless of the kinds of operation; in the DCT, it exceeds 250 MHz. The power at 200 MHz decreases in the order of the FIR filter, the DCT, the Laplacian filter, and the FFT. As for the kinds of function used for the operation, the number of used times increases in the order of the DSPs, the tiles, the FFs, and the LUTs.

Figure 34:
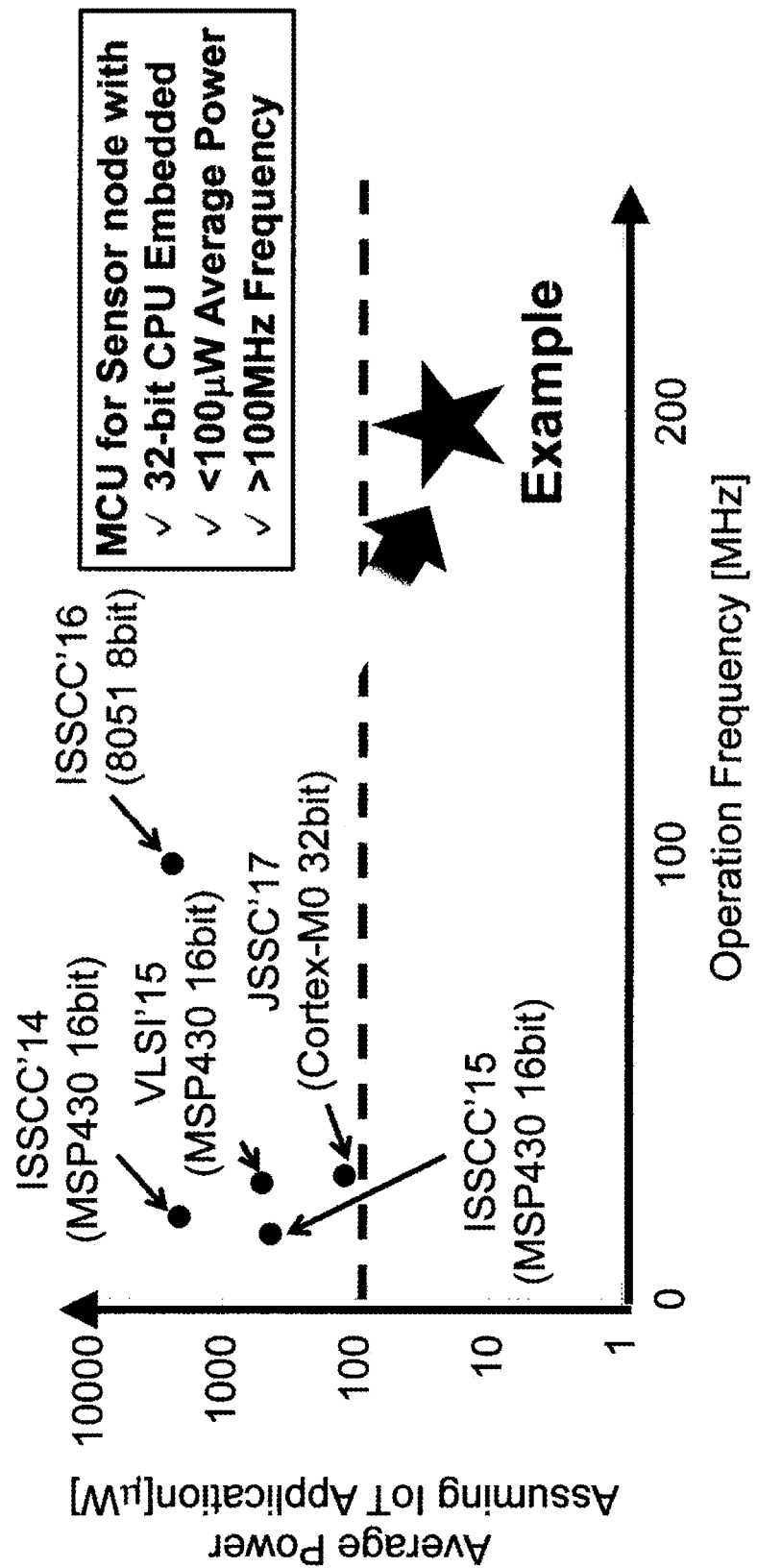
FIG. 34 is a graph to illustrate relations between the operating frequency and average power assuming it is used for an IoT application according to FIG. 33.

The present example will be compared with other conventional embodiments. FIG. 33 is a table comparing the present example with conventional examples (Non Patent Literatures 1 to 5). FIG. 34 is a graph to illustrate relations between the operating frequency and average power assuming it is used for an IoT application according to FIG. 33. The example with FPGA is according to the technique in Non Patent Literature 3. The operating frequency in Non Patent Literature 3 is 25 MHz while that in the present example is 200 MHz, which enables a high data-processing performance. The average power in the present example is 47.14 μW while that in the conventional examples are larger numbers with more digits. Thus, a device according to the present example and embodiments of the present invention can first provide a device with low-power and high-performance and a sensor node using the same.

Although the present description uses the abbreviations "NV-CPU" and "NV-FPGA", they can be interpreted as "nonvolatile CPU" and "nonvolatile FPGA". In addition, the term "memory cell", used in an NV-CPU, an NV-FPGA, and an MRAM, can be referred to as storage area. The NV-FPGA is an FPGA-ACC shown in FIG. 30, or an FPGA-based accelerator. Needless to say, if volatile units are used, data stored in nonvolatile area in a nonvolatile CPU and a nonvolatile FPGA (nonvolatile FPGA-ACC) are subject to be backed up and written at power-gating.

Concepts of embodiments of the present inventions are as follows.

First, a device includes:
an MRAM configured to include multiple memory cells separated into multiple regions including selection transistors and MTJs;
a nonvolatile CPU configured to include a nonvolatile memory;
a nonvolatile FPGA-ACC configured to include a nonvolatile memory and execute a part of operations on the nonvolatile CPU; and
a power-gating controller that controls power supply to each memory cell in the MRAM, the nonvolatile CPU, and the nonvolatile FPGA-ACC.

This allows a configuration as an FPGA-based accelerator to separately perform computing of the nonvolatile FPGA-ACC and the nonvolatile CPU; and to store data in the MRAM to be related to computing of the nonvolatile FPGA-ACC and the nonvolatile CPU. First, since both of the FPGA and the CPU are nonvolatile, it is unnecessary to back up or write the data and the configuration data in the FPGA whenever power-gating is performed by the power gating controller, further, it is also unnecessary to back up or write the data in the CPU (see FIGS. 2A to 2C). Second, the CPU and the FPGA-based accelerator (FPGA-ACC) parallelly process sequential processing (processing in order according to the sequence) between operation intervals. The parallel processing can significantly reduce the processing time, which allows for a longer power gating (PG) time; and thus, being unnecessary for both static and dynamic power for the increased power-gating time due to the parallel processing, that is, for the reduced processing time by the FPGA-ACC. This unnecessary power is far greater than the increased power consumption due to the computing of the FPGA-ACC (see FIGS. 3A and 3B). Thus, to provide a nonvolatile FPGA-ACC to a nonvolatile microcomputer configured with a nonvolatile CPU and an MRAM can realize high performance and low power consumption. A shorter processing time can reduce the operating time of the MRAM, which consumes most of the power, thereby achieving further lower power consumption. By making a nonvolatile CPU and a nonvolatile FPGA-ACC connectable to each other, sequential processing can be parallelly processed by the nonvolatile CPU and the nonvolatile FPGA-ACC (see FIG. 28). The FPGA, in particular, can undertake computing owing to its reconfigurability and is suitable for parallel processing with the CPU, which allows flexible computing in sensor node.

Second, the above-described device further includes an access controller that controls accesses to the MRAM by reading data in advance and backing up the data when the data are to be read from the MRAM. Such an access controller receives a data-reading instruction from the nonvolatile CPU and determines whether or not the data have been read from the MRAM in advance, and if the data have been already read, the access controller transmits the stored data to the nonvolatile CPU. This enables a multiplexing access from the CPU to the MRAM and allows the read data to be temporally saved in the accelerator. When accesses to the same memory address are repeated, temporally-saved data are not read from the MRAM and is reused (see FIGS. 10A to 10F.

Such a configuration of an accelerator can be embodied as shown in FIG. 9, for example.

The access controller includes:
an address-storing register that receives an input about an MRAM address that is a reading destination, the address-storing resister storing the address;
a multiplexer that outputs multiple destinations of the MRAM stored in the address-storing register to the MRAM for reading;
multiple data-storing registers that store data read from the MRAM in response to an input from the multiplexer; and
a comparator that receives a reading instruction together with a specified reading destination and compares an address related to the specified reading destination with a reading address stored in the address-storing register, wherein
the access controller that receives a reading instruction together with a specified reading destination and outputs data already read and stored in any one of the data-storing registers in response to the reading instruction when the comparator determines the data have been read from the MRAM in advance.

In addition, the access controller further including a prefetch address generator connected to the multiplexer, wherein
the prefetch address generator generates an address including a reading address destination stored in the address-storing register.

Third, a data transfer method between a CPU and an MRAM via an access controller, including:
the access controller receiving a data-reading instruction from the CPU together with a reading address;
the access controller reading multiple address data including the reading address from the MRAM in advance;
the access controller receiving a data-reading instruction from the CPU together with a next reading address; and
the access controller determining whether or not the data have been already read and responding to the reading instruction, if the reading instruction is for already-read data, using the data read in advance without performing data-reading from the MRAM.

That is, it can simultaneously perform a prefetch data request, data storage in the access controller, and a fetch operation, and also can sequentially perform fetch operations (see FIGS. 10A to 10F), thus, an instruction fetch can be executed at high speed without interruption. It is useful for sequential performance, for example, in a sensor node application, and effectively functions owing to regular access to the memories. It can improve the system performance without changing performance requirements for the MRAM but only with a power overhead of the access controller, which allows for a faster operating frequency of the CPU. The access controller, which can be embedded in a chip as an acceleration unit with a small area overhead, can implement a faster operating frequency of the CPU, which guarantees a writing and reading operations in a wide temperature range.

Fourth, a processing method in a microcontroller including a nonvolatile CPU, an MRAM, and a nonvolatile FPGA-ACC as a reconfigurable computing module, wherein
the MRAM is configured with a region to store data transmitted between the nonvolatile CPU and the nonvolatile FPGA-ACC,
the method comprises:
the MRAM writing data into the region, the data being input from the nonvolatile CPU to the nonvolatile FPGA-ACC;

the nonvolatile CPU passing a signal indicating completion of preparation for the writing and starting a calculation to the nonvolatile FPGA-ACC;

the nonvolatile FPGA-ACC starting an operation by using the data written in the region; and the nonvolatile CPU being passed an operation result computed by the nonvolatile FPGA-ACC to the nonvolatile CPU through the region.

This method enables an efficient processing in a microcontroller because it is unnecessary to pass information about the memory address storing data required for processing between a nonvolatile CPU, a nonvolatile FPGA-ACC, and an MRAM.

In the above-described processing method, in particular, it is preferable that power-gating control is performed for the nonvolatile CPU and the nonvolatile FPGA-ACC. The power-gating control is to supply power only during computing, that is, not to supply power during inactive intervals. Using the nonvolatile CPU and the nonvolatile FPGA-ACC removes the need for baking up or writing data when the power is turning ON or OFF. Thus, power-gating can reduce average power consumption and the longer the intermittent operation interval, the less power is consumed (see the result "with PG & FPGA-ACC" in FIG. 30).

In the above-described processing method, in particular, it is preferable that computing by the nonvolatile FPGA-ACC relates to any one of processes by a Laplacian filter, a DCT (Discrete Cosine Transform), an FIR (Finite Impulse Response) filter, and an FFT (Fast Fourier Transform). In the case a processing method in a microcontroller as an IoT sensor node, in particular, as explained with reference to FIGS. 4 and 5, it is preferable to suppress data amount in the terminal end sensor node 110, for example, by obtaining a feature value or processing an image, and to transmit the data to a higher unit cloud system 140 in order to avoid processing of the sensor data in cloud system 140. Thus, it is suitable for any one of these processes.

In the above-described processing method, in particular, it is preferable that the nonvolatile CPU and a nonvolatile FPGA-based accelerator parallelly perform sequential processing. The sequential processing by the nonvolatile CPU and the nonvolatile FPGA-ACC in parallel realizes high computing performance and low power consumption, thus, it is preferably applied for an IoT sensor node.

REFERENCE SIGNS LIST

1: device
2, 11: STT-MRAM (MRAM)
3, 12: NV-CPU
4, 13: NV-FPGA
5: power-gating controller
6, 14: access controller
7: bus
100: system
110: sensor node
120: gateway (GW)
130: communications network
140: cloud system

The invention claimed is:

1. A device, comprising:
an MRAM configured to include multiple memory cells separated into multiple regions including selection transistors and MTJs;
a nonvolatile CPU configured to include a nonvolatile memory;
a nonvolatile FPGA-ACC configured to include a nonvolatile memory and execute a part of operations on the nonvolatile CPU in parallel; and
a power-gating controller configured to control power supply to each memory cell in the MRAM, the nonvolatile CPU, and the nonvolatile FPGA-ACC,
wherein the device is a single-chip microcomputer having the MRAM, the nonvolatile CPU, the nonvolatile FPGA-ACC, and the power-gating controller.

2. The device according to claim 1, wherein
the nonvolatile CPU configured to transmit data to the MRAM, allowing the nonvolatile FPGA-ACC to read the data from the MRAM; and
the nonvolatile FPGA-ACC configured to transmit data to the MRAM, allowing the nonvolatile CPU to read the data from the MRAM.

3. The device according to claim 1, wherein
the nonvolatile FPGA-ACC comprises a nonvolatile memory function, which stores configuration data.

4. The device according to claim 1, wherein
each memory cell in the MRAM is configured with 2T-2MTJ including two selection transistors and two MTJs.

5. The device according to claim 1, wherein
each of the plurality of regions in the MRAM is configured with divided blocks and power-gating is performed for each of the divided blocks.

6. The device according to claim 1, wherein
the nonvolatile FPGA-ACC comprises:
a tile configured to perform a part of operations on the nonvolatile CPU instead of the nonvolatile CPU; and
a DSP (Digital Signal Processor) configured to perform a part of the operations on the nonvolatile CPU instead of the nonvolatile CPU faster than the tile.

7. The device according to claim 1, further comprising:
an access controller configured to control an access to the MRAM by reading and storing data in advance and backing up the data when the data are to be read from the MRAM.

8. The device according to claim 7, wherein
the access controller receives a data-reading instruction from the nonvolatile CPU and determines whether or not the data have been read from the MRAM in advance, and if the data have been already read, the access controller transmits the stored data to the nonvolatile CPU.

9. The device according to claim 1, being usable when an average power is no more than 100 μW.

10. The device according to claim 1, wherein
an intermittent operation interval can be set to no more than 100 ms.

11. A sensor node, configured to include the device according to claim 1.

12. The device according to the claim 1, wherein the microcomputer further comprises a bus; the bus connecting the MRAM; the nonvolatile CPU; and the nonvolatile FPGA-ACC.

13. The device according to the claim 1, wherein the nonvolatile CPU comprises a plurality of flip-flops, each flip-flop being nonvolatile.

14. The device according to the claim 1, wherein each memory cell comprises a first MTJ element connected to a bit line; a first transistor connected to the first MTJ element; a second MTJ element connected to a bit-bar line; and a second transistor connected to the second MTJ element, wherein the first MTJ element and the second MTJ element are connected to a shared-write bit line.

15. The device according to the claim 1, wherein the FPAG-ACC comprises: a plurality of tiles; and a plurality of power gate switches, each power gate being provided for each tile, wherein each tile comprises: a configuration logic block; a connecting block to interface the configuration logic block to some routing tracks; and a switch block for signal routing, wherein the configuration logic block has a Look up table circuit with a nonvolatile storage area comprising MTJ elements, a flip-flop circuit with a nonvolatile storage area comprising MTJ elements and a multiplexer circuit, wherein the switch block and the connecting block are both configured to include a routing switch, the routing switch including a nonvolatile storage area to store configuration data, and a state of each flip-flop.

16. The device according to the claim 1, wherein the FPAG-ACC further comprises: one or more digital signal processing; and a power switch for each digital signal processing, each digital signal processing having a switch block and a connecting block; and wherein the switch block and the connecting block are both configured to include a routing switch, the routing switch including a nonvolatile storage area.

17. A device, comprising:
an MRAM configured to include multiple memory cells separated into multiple regions including selection transistors and MTJs;
a nonvolatile CPU configured to include a nonvolatile memory;
a nonvolatile FPGA-ACC configured to include a nonvolatile memory and execute a part of operations on the nonvolatile CPU; and
a power-gating controller configured to control power supply to each memory cell in the MRAM, the nonvolatile CPU, and the nonvolatile FPGA-ACC,
the device further comprising:
an access controller configured to control an access to the MRAM by reading and storing data in advance and backing up the data when the data are to be read from the MRAM, wherein
the access controller comprises:
an address-storing register configured to receive an input about an MRAM address that is a reading destination, the address-storing resister storing the address;
a multiplexer configured to output multiple destinations of the MRAM stored in the address-storing register to the MRAM for reading;
multiple data-storing registers configured to store data read from the MRAM; and
a comparator configured to receive a reading instruction together with a specified reading destinations and to compare an address related to the specified reading destination with a reading address stored in the address-storing register, wherein
the access controller configured to receive a reading instruction together with a specified reading destinations and to output data already read and stored in any one of the plurality of data-storing registers in response to the reading instruction when the comparator determines the data have been read from the MRAM in advance.

18. The access controller according to claim 17, further comprising:

a prefetch address generator connected to the multiplexer, wherein
the prefetch address generator generates an address including a reading address destination stored in the address-storing register.

19. The device according to the claim 17, wherein the device is a single-chip microcomputer having the MRAM, the nonvolatile CPU, the nonvolatile FPGA-ACC, and the power-gating controller.

20. A processing method in a microcontroller comprising a nonvolatile CPU, an MRAM, and a nonvolatile FPGA-ACC as a reconfigurable computing module, wherein
the microcontroller is a single-chip microcomputer having the MRAM, the nonvolatile CPU, the nonvolatile FPGA-ACC, and a power-gating controller, and
the nonvolatile FPGA-ACC is configured to include a nonvolatile memory and execute a part of operations on the nonvolatile CPU in parallel, and
the MRAM is configured with a region to store data transmitted between the nonvolatile CPU and the nonvolatile FPGA-ACC, and
the method comprises:
the MRAM writing data into the region, the data being input from the nonvolatile CPU to the nonvolatile FPGA-ACC;
the nonvolatile CPU passing a signal indicating completion of preparation for the writing and starting a calculation to the nonvolatile FPGA-ACC;
the nonvolatile FPGA-ACC starting an operation by using the data written in the region; and
the nonvolatile CPU being passed an operation result computed by the nonvolatile FPGA-ACC to the nonvolatile CPU through the region.

21. The processing method in the microcontroller according to claim 20, wherein
the nonvolatile CPU and the nonvolatile FPGA-ACC are subject to power-gating control.

22. The processing method in the microcontroller according to claim 21, wherein
the power-gating control does not include data-store or restore operations.

23. The processing method in the microcontroller according to claim 20, wherein
computing by the nonvolatile FPGA-ACC relates to any one of processing of a Laplacian filter, a DCT (Discrete Cosine Transform), an FIR (Finite Impulse Response) filter, and an FFT (Fast Fourier Transform).

24. The processing method in the microcontroller according to claim 20, wherein
the nonvolatile CPU and a nonvolatile FPGA-based accelerator parallelly process sequential processing.

25. The processing method according to claim 20, wherein
the writing data from the nonvolatile CPU into the region is achieved via a bus connecting between the nonvolatile CPU and the nonvolatile FPGA-ACC, and
the nonvolatile CPU being passed is achieved via the bus.

* * * * *